(12) United States Patent
Park et al.

(10) Patent No.: US 11,894,055 B2
(45) Date of Patent: Feb. 6, 2024

(54) SEMICONDUCTOR DEVICE

(71) Applicant: Samsung Electronics Co., Ltd., Suwon-si (KR)

(72) Inventors: Ansoo Park, Hwaseong-si (KR); Ahreum Kim, Hwaseong-si (KR); Homoon Shin, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 17/578,840

(22) Filed: Jan. 19, 2022

(65) Prior Publication Data

US 2022/0392532 A1 Dec. 8, 2022

(30) Foreign Application Priority Data

Jun. 4, 2021 (KR) .................. 10-2021-0072834

(51) Int. Cl.
  *G11C 7/00* (2006.01)
  *G11C 16/08* (2006.01)
  *G11C 16/30* (2006.01)
(52) U.S. Cl.
  CPC ............. *G11C 16/08* (2013.01); *G11C 16/30* (2013.01)
(58) Field of Classification Search
  CPC ...................................... G11C 16/30
  USPC ........................................ 365/226
  See application file for complete search history.

(56) References Cited

U.S. PATENT DOCUMENTS

| 7,087,953 | B2 | 8/2006 | Lee |
| 7,679,133 | B2 | 3/2010 | Son et al. |
| 8,487,383 | B2 | 7/2013 | Park et al. |
| 8,553,466 | B2 | 10/2013 | Han et al. |
| 8,559,235 | B2 | 10/2013 | Yoon et al. |
| 8,654,587 | B2 | 2/2014 | Yoon et al. |

(Continued)

FOREIGN PATENT DOCUMENTS

| KR | 100206715 B1 | 7/1999 |
| KR | 10-2000-0032294 A | 6/2000 |
| KR | 100273705 B1 | 12/2000 |

OTHER PUBLICATIONS

Partial European Search Report dated Oct. 11, 2022 issued in related European patent application No. 22174269.5.

*Primary Examiner* — Hoai V Ho
(74) *Attorney, Agent, or Firm* — Harness, Dickey & Pierce, P.L.C.

(57) ABSTRACT

A semiconductor device includes: a peripheral circuit region including circuit elements on a substrate, the circuit elements of a page buffer and a row decoder; and a cell region including gate electrode layers, stacked in a first direction, perpendicular to an upper surface of the substrate, and connected to the row decoder, and channel structures extending in the first direction to penetrate through the gate electrode layers and to be connected to the page buffer. The row decoder includes high-voltage elements, operating at a first power supply voltage, and low-voltage elements operating at a second power supply voltage, lower than the first power supply voltage. Among the high-voltage elements, at least one first high-voltage device is in a first well region doped with impurities having a first conductivity-type. At least one of the low-voltage elements is in a second well region surrounding the first well region and doped with impurities having a second conductivity-type, different from the first conductivity-type.

15 Claims, 24 Drawing Sheets

(56) References Cited

U.S. PATENT DOCUMENTS

| | | |
|---|---|---|
| 8,681,556 B2 | 3/2014 | Kutsukake et al. |
| 2006/0145238 A1 | 7/2006 | Fontana et al. |
| 2011/0233648 A1 | 9/2011 | Seol et al. |
| 2020/0043549 A1 | 2/2020 | Shibata et al. |
| 2020/0118629 A1 | 4/2020 | Kim et al. |
| 2022/0028731 A1* | 1/2022 | Shim .................... H10B 41/35 |

* cited by examiner

US 11,894,055 B2

SEMICONDUCTOR DEVICE

CROSS-REFERENCE TO RELATED APPLICATION(S)

This application claims benefit of priority to Korean Patent Application No. 10-2021-0072834 filed on Jun. 4, 2021 in the Korean Intellectual Property Office, the disclosure of which is incorporated herein by reference in its entirety.

BACKGROUND

The present disclosure relates to a semiconductor device.

A semiconductor device may include a cell region, in which memory cells writing data thereto are disposed, and a peripheral circuit region in which circuits controlling the cell region are disposed. The peripheral circuit region may include a row decoder, a page buffer, a voltage generator, a control logic circuit, and/or the like. The row decoder may be connected to the cell region through wordlines, ground select lines, string select lines, and/or the like. To improve the degree of integration of a semiconductor device, various methods for increasing the degree of integration of a peripheral circuit region as well as a cell region have been proposed.

SUMMARY

Example embodiments provide a semiconductor device having improved performance and/or degree of integration by forming high-voltage elements and low-voltage elements together in a first region to which a negative voltage is input from a peripheral circuit region and also forming low-voltage elements in a second well region surrounding the first well region.

According to example embodiments, a semiconductor device includes: a peripheral circuit region including circuit elements on a substrate, the circuit elements of a page buffer and a row decoder; and a cell region including gate electrode layers, stacked in a first direction, perpendicular to an upper surface of the substrate, and connected to the row decoder, and channel structures extending in the first direction to penetrate through the gate electrode layers and to be connected to the page buffer. The row decoder includes high-voltage elements, operating at a first power supply voltage, and low-voltage elements operating at a second power supply voltage, lower than the first power supply voltage. Among the high-voltage elements, at least one first high-voltage element is in a first well region doped with impurities having a first conductivity-type. At least one of the low-voltage elements is in a second well region surrounding the first well region and doped with impurities having a second conductivity-type, different from the first conductivity-type.

According to example embodiments, a semiconductor device includes: a peripheral circuit region including a substrate having a first well region doped with impurities having a first conductivity-type and a second well region doped with impurities having a second conductivity-type, different from the first conductivity-type, NMOS elements in the first well region, and PMOS elements in the second well region; and a cell region including gate electrode layers stacked in a first direction, perpendicular to an upper surface of the substrate, and channel structures extending in the first direction to penetrate through the gate electrode layers. A thickness of a gate insulating layer included in at least one of the NMOS elements in the first well region is the same as a thickness of a gate insulating layer included in at least one of the PMOS elements in the second well region.

According to example embodiments, a semiconductor device includes: a cell region including a plurality of memory cell strings, each including a channel layer connected between a bitline and a common source line, memory cells sharing the channel layer and connected to each other in series, and wordlines connected to the memory cells, are disposed; and a peripheral circuit region including a row decoder connected to the wordlines and a page buffer connected to the bitline. Among NMOS elements and PMOS elements of the row decoder, high-voltage NMOS elements, operating at a first power supply voltage and having a body to which a negative voltage is input, and first low-voltage NMOS elements, operating at a second power supply voltage, lower than the first power supply voltage, and having a body to which a negative voltage is input, are in a single first well region. The high-voltage NMOS elements are connected to the wordlines in the row decoder.

According to example embodiments, a semiconductor device includes: a substrate including a first well region, doped with impurities having a first conductivity-type, and a second well region surrounding the first well region and doped with impurities having a second conductivity-type, different from the first conductivity-type; a plurality of NMOS elements in the first well region; and a plurality of PMOS elements in the second well region. The first well region is a pocket P-well. At least one of the plurality of NMOS elements includes at least one first NMOS element and at least one second NMOS element, and the at least one second NMOS element operates at the same power supply voltage as the plurality of PMOS elements.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
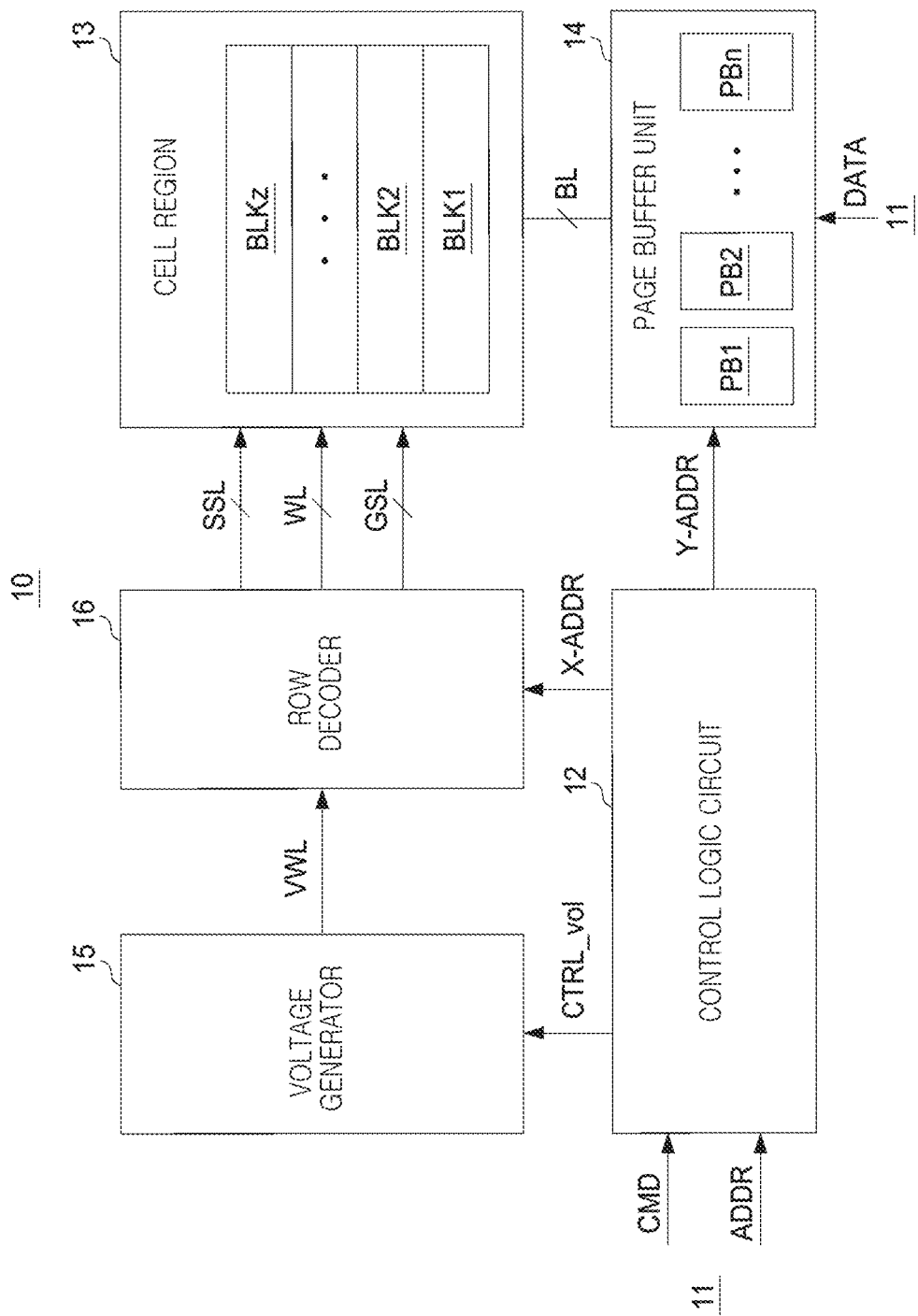
FIG. 1 is a schematic block diagram of a semiconductor device according to example embodiments.

FIG. 1 is a schematic block diagram of a semiconductor device according to example embodiments.

Referring to FIG. 1, a semiconductor device 10 may include a control logic circuit 12, a cell region 13, a page buffer unit 14, a voltage generator 15, and/or a row decoder 16. The semiconductor device 10 may further include an interface circuit 11, and may further include a column logic, a pre-decoder, a temperature sensor, a command decoder, an address decoder, a source driver, and/or the like. The semiconductor device 10 may be a memory device storing data, for example, a nonvolatile memory device retaining stored data even when a power supply thereof is interrupted.

The control logic circuit 12 may control overall operations in the semiconductor device 10. The control logic circuit 12 may output various control signals in response to a command CMD and/or an address ADDR from the interface circuit 11. For example, the control logic circuit 12 may output a voltage control signal CTRL_vol, a row address X-ADDR, and a column address Y-ADDR.

The cell region 13 may include a plurality of memory blocks BLK1 to BLKz (where z is a positive integer), and each of the plurality of memory blocks BLK1 to BLKz may include a plurality of memory cells. For example, the plurality of memory blocks BLK1 to BLKz may include main blocks, storing data, and at least one spare block storing data required for an operation of the semiconductor device 10. The cell region 13 may be connected to the page buffer unit 14 through bitlines BL, and may be connected to the row decoder 16 through wordlines WL, string select lines SSL, and ground select lines GSL.

In example embodiments, the cell region 13 may include a three-dimensional memory cell array, and the three-dimensional memory cell array may include a plurality of NAND strings. Each of the NAND strings may include memory cells, respectively connected to wordlines vertically stacked on a substrate. U.S. Pat. Nos. 7,679,133, 8,553,466, 8,654, 587, 8,559,235, and U.S. Patent Application Publication No. 2011/0233648 are incorporated herein by reference in their entirety. In example embodiments, the cell region 13 may include a two-dimensional memory cell array, and the two-dimensional memory cell array may include a plurality of NAND strings arranged in row and column directions.

The page buffer unit 14 may include a plurality of page buffers PB1 to PBn (where n is an integer greater than or equal to 3). The plurality of page buffers PB1 to PBn may include a plurality of bitlines BL may be connected to the memory cells, respectively. The page buffer unit 14 may select at least one of the bitlines BL in response to the column address Y-ADDR. The page buffer unit 14 may operate as a write driver or a sense amplifier, depending on an operation mode. For example, during a program operation, the page buffer unit 14 may apply a bitline voltage corresponding to data to be programmed in a selected bitline. During a read operation, the page buffer unit 14 may sense current or a voltage of a selected bitline to sense data stored in a memory cell. Data to be programmed in the cell region 13 by a program operation and data read from the cell region 13 by a read operation may be input/output through the interface circuit 11.

The voltage generator 15 may generate various types of voltages for performing program, read, and erase operations based on the voltage control signal CTRL_vol. For example, the voltage generator 15 may generate a program voltage, a read voltage, a pass voltage, a program verify voltage, an erase voltage, and/or the like. In example embodiments, the control logic circuit 12 may control the voltage generator 15 to generate a voltage for performing program, read, and erase operations using data stored in a spare block. Some of the voltages generated by the voltage generator 15 may be input to the wordlines WL as a wordline voltage VWL by the row decoder 16, and some of the voltages may be input to a common source line by a source driver.

The row decoder 16 may select one of the plurality of wordlines WL and select one of the plurality of string selection lines SSL in response to the row address X-ADDR. For example, the row decoder 16 may apply a program voltage and a program verify voltage to a selected wordline during a program operation, and may apply a read voltage to the selected wordline during a read operation.

Figure 2:
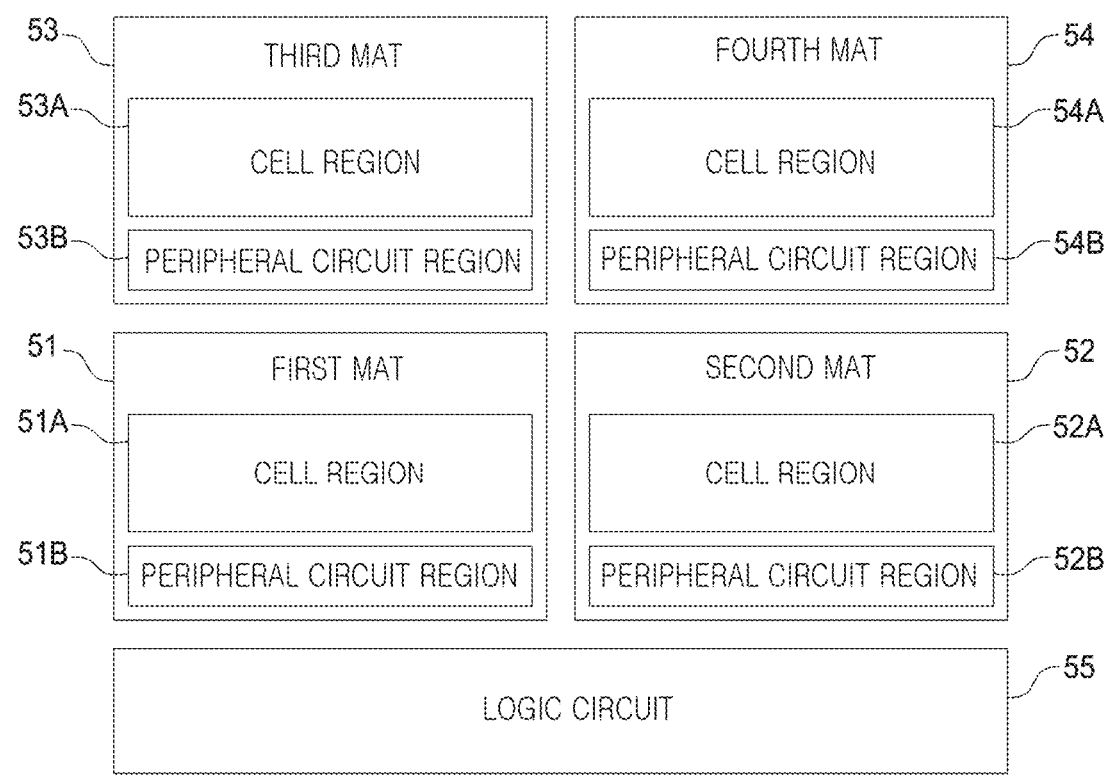
FIG. 2 is a schematic diagram of a semiconductor device according to example embodiments.

FIG. 2 is a schematic diagram of a semiconductor device according to example embodiments.

Referring to FIG. 2, a semiconductor device 50 according to an example may include a plurality of mats 51 to 54 and/or a logic circuit 55. As an example, each of the plurality of mats 51 to 54 may include the cell region 13, the page buffer unit 15, and the row decoder 16 described with reference to FIG. 1, and the logic circuit 55 may include a control logic circuit 12 and a voltage generator 15, and/or the like.

According to example embodiments, each of the plurality of mats 51 to 54 may operate independently of each other. For example, while the first mat 51 performs a program operation to write data received from an external memory controller, the logic circuit 55 may read data stored in the second mat 52 and output the read data to an external entity.

Each of the plurality of planes 51 to 54 may include a cell region and a peripheral circuit region. The cell region may include memory cells, and the peripheral circuit region may include circuits for controlling the cell region, for example, a row decoder, a page buffer unit, and/or the like.

In example embodiments, a cell region of each of the plurality of mats 51 to 54 may include a plurality of blocks. As described above, the plurality of blocks include main blocks, storing data and outputting the stored data in response to a command from the logic circuit 55, and a spare block storing data required for an operation of the semiconductor device 50.

Figure 3:
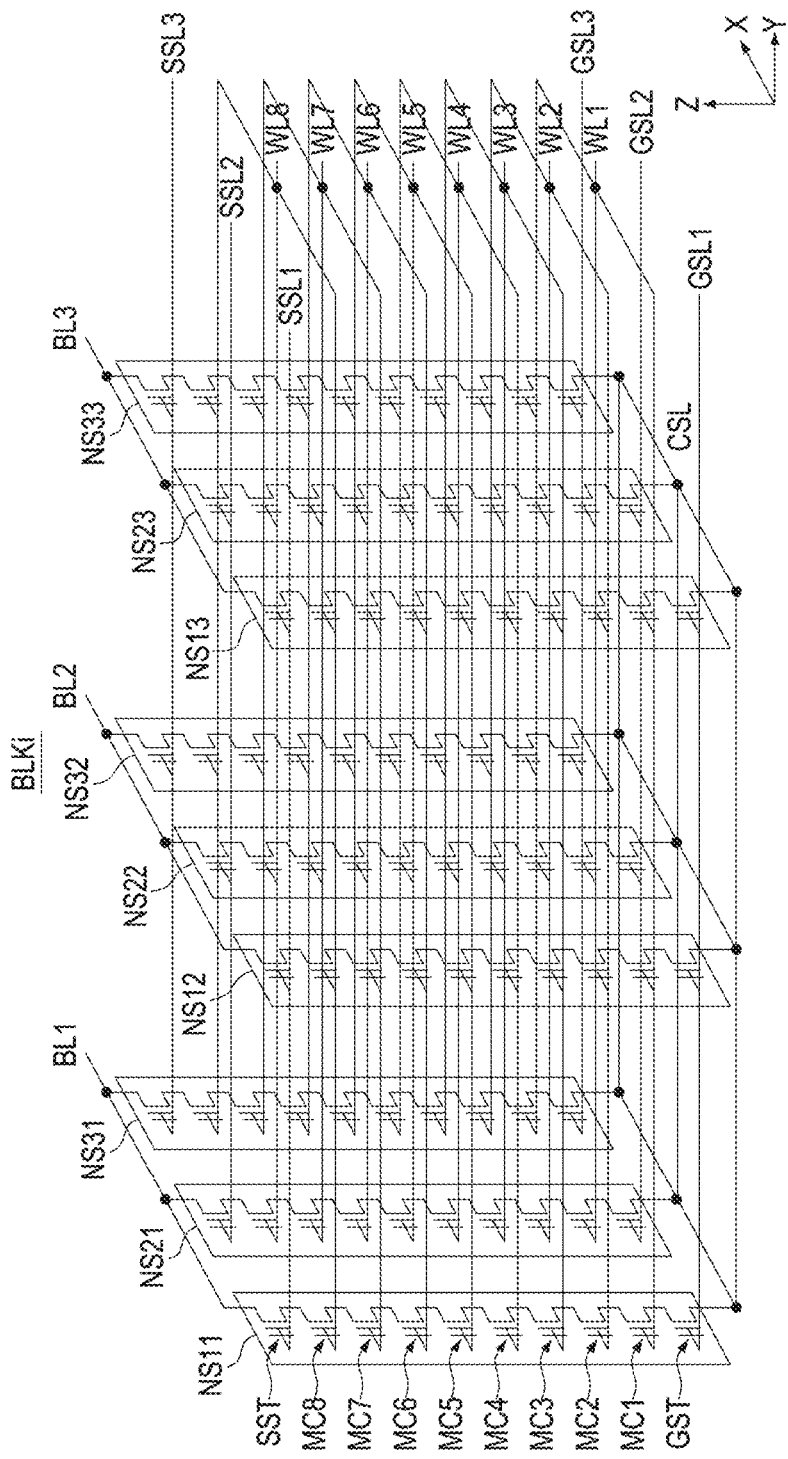
FIG. 3 is a schematic circuit diagram of a memory block of a semiconductor device according to example embodiments.

FIG. 3 is a schematic circuit diagram of a memory block of a semiconductor device according to example embodiments.

A memory block BLKi illustrated in FIG. 3 represents a three-dimensional memory block formed on a substrate in a three-dimensional structure. For example, a plurality of NAND strings included in the memory block BLKi may be formed in a direction, perpendicular to a substrate.

Referring to FIG. 3, the memory block BLKi may include a plurality of NAND strings NS11 to NS33 connected between bitlines BL1, BL2, and BL3 and a common source line CSL. Each of the plurality of NAND strings NS11 to NS33 may include a string select transistor SST, a plurality of memory cells MC1, MC2, . . . , and MC8, and a ground select transistor GST. In FIG. 3, each of the plurality of memory NAND strings NS11 to NS33 is illustrated as including eight memory cells MC1, MC2, . . . , and MC8, but example embodiments are not limited thereto.

The string select transistor SST may be connected to corresponding string select lines SSL1, SSL2, and SSL3. The plurality of memory cells MC1, MC2, . . . , and MC8 may be connected to corresponding wordlines WL1, WL2, . . . , and WL8, respectively. According to example embodiments, at least one of the wordlines WL1, WL2, . . . , and WL8 may be provided as a dummy wordline. The ground select transistor GST may be connected to corresponding ground select lines GSL1, GSL2, and GSL3. The string select transistor SST may be connected to corresponding bitlines BL1, BL2, and BL3, and the ground select transistor GST may be connected to the common source line CSL.

Wordlines (for example, WL1) disposed on the same height level may be commonly connected, and ground select lines GSL1, GSL2, and GSL3 and string select lines SSL1, SSL2, and SSL3 may be separated from each other, respectively. In FIG. 3, the memory block BLKi is illustrated as being connected to eight wordlines WL1, WL2, . . . , and WL8 and three bitlines BL1, BL2, and BL3, but example embodiments are not limited thereto.

Figure 4:
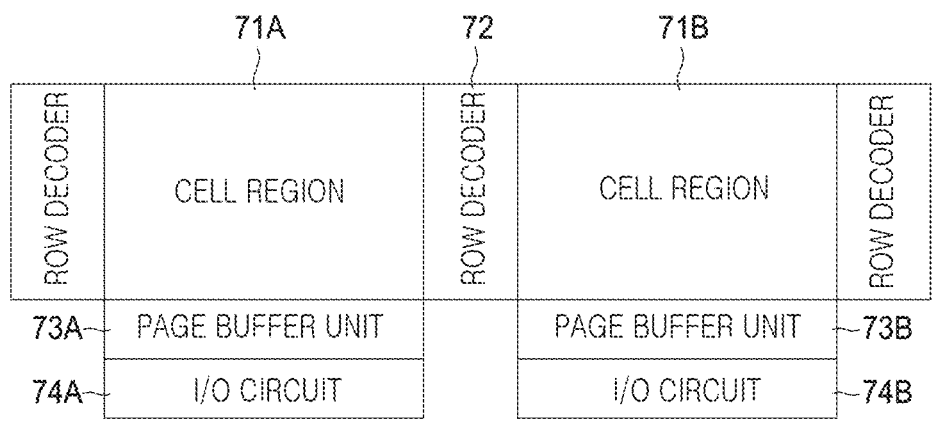
FIG. 4 is a schematic diagram illustrating a layout of a cell region and a peripheral circuit region in a semiconductor device according to example embodiments.

FIG. 4 is a schematic diagram illustrating a layout of a cell region and a peripheral circuit region in a semiconductor device according to example embodiments.

FIG. 4 may be a diagram illustrating a layout of a cell region and a peripheral circuit region in a single mat, among mats included in a semiconductor device 70 according to example embodiments. Referring to FIG. 4, a peripheral circuit region may be disposed around cell regions 71A and 71B. As an example, the row decoder 72 may be disposed on opposite sides adjacent to each of the cell regions 71A and 71B. The page buffers 73A and 73B may be disposed below the cell regions 71A and 71B, respectively. The row decoder 72 and the page buffer units 73A and 73B may be connected to a logic circuit, controlling the overall operation of the semiconductor device 70, and an input/output interface, communicating with an external device, through the input/output circuits 74A and 74B.

As an example, wordlines included in each of the cell regions 71A and 71B may extend in a horizontal direction to be connected to the row decoder 72 adjacent to the cell regions 71A and 71B. Bitlines included in each of the cell regions 71A and 71B may extend in a vertical direction to be connected to the page buffer units 73A and 73B, respectively disposed below the cell regions 71A and 71B. In example embodiments illustrated in FIG. 4, the cell regions 71A and 71B, the row decoder 72, the page buffers 73A and 73B, the input/output circuits 74A and 74B, and/or the like, may be formed on a single substrate.

Figure 5:
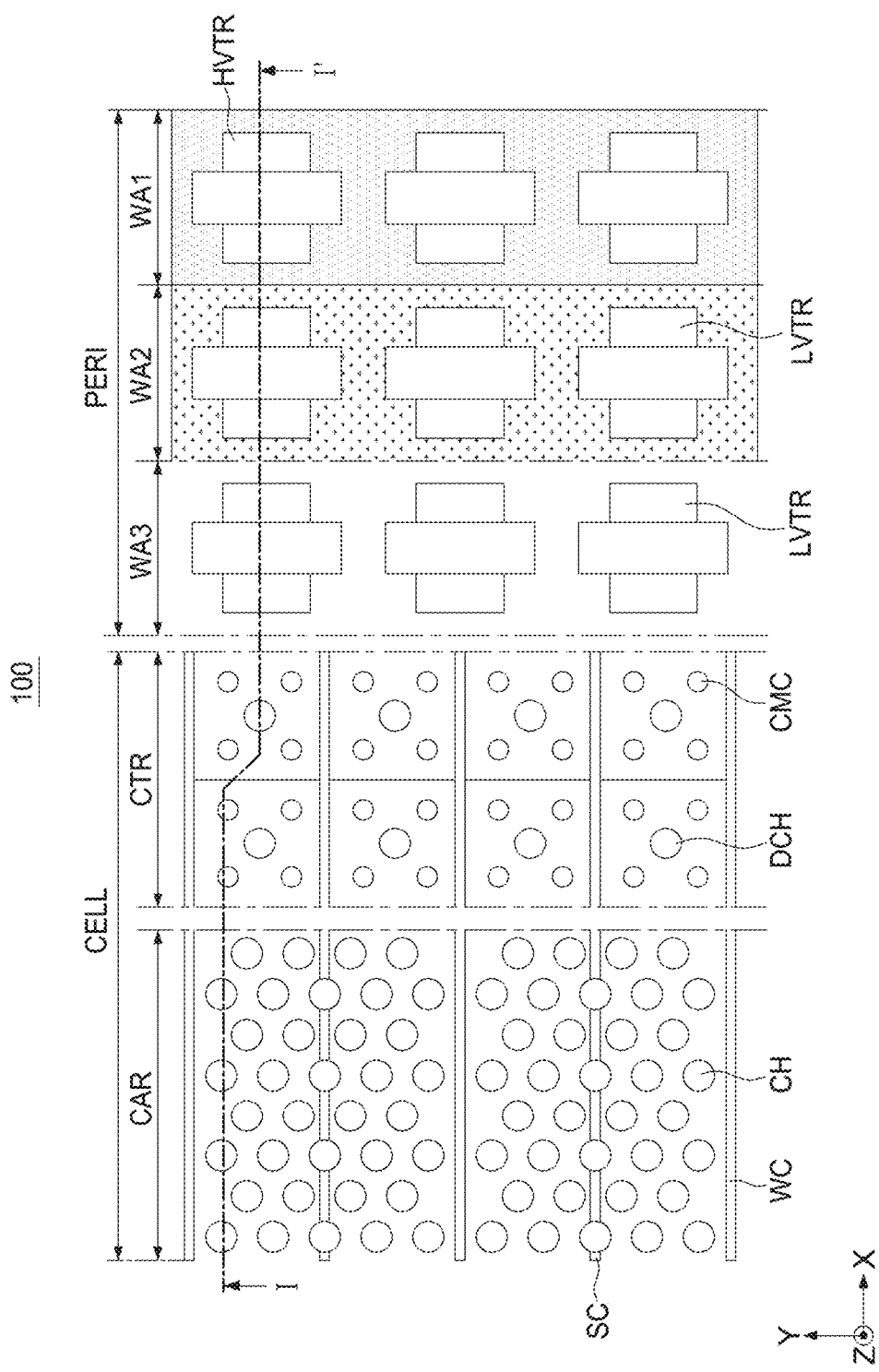
FIG. 5 is a diagram illustrating a structure of a semiconductor device according to example embodiments.
Figure 6:
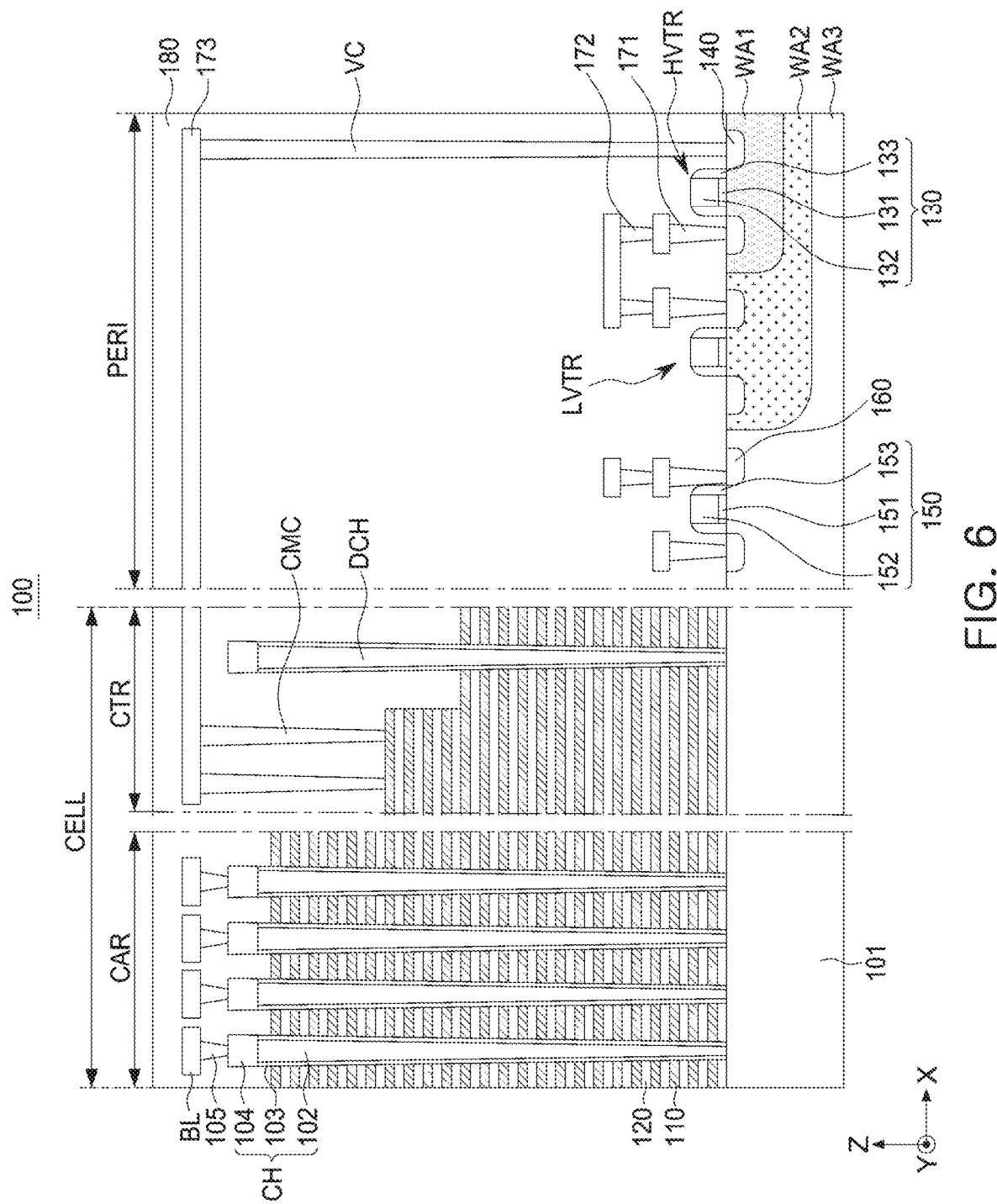
FIG. 6 is a cross-sectional view taken along line I-I' of FIG. 5.

FIG. 5 is a diagram illustrating a structure of a semiconductor device according to example embodiments, and FIG. 6 is a cross-sectional view taken along line I-I' of FIG. 5.

FIG. 5 may be a plan view illustrating a portion of a semiconductor device 100 according to example embodiments. Referring to FIG. 5, the semiconductor device 100 may include a cell region CELL and a peripheral circuit region PERI, and the cell region CELL may include a cell array region CAR and a cell contact region CTR. As an example, the cell array region CAR may be a region in which channel structures CH are disposed, and the cell contact region CTR may be a region in which cell contacts CMC are disposed. In example embodiments illustrated in FIG. 5, the cell contact region CTR may be disposed between the cell array region CAR and the peripheral circuit region PERI.

Referring to FIGS. 5 and 6 together, the cell array region CAR may include gate electrode layers 110 and insulating layers 120, stacked in a first direction (a Z-axis direction), perpendicular to an upper surface of a substrate 101, channel structures CH extending in the first direction to penetrate through the gate electrode layers 110 and the insulating layers 120, and/or the like. Each of the channel structures CH may include a channel layer 102 connected to the substrate 101, a gate dielectric layer 103 disposed between the channel layer 102 and the gate electrode layers 120, a drain region 104, and/or the like. The gate dielectric layer 103 may include a tunneling layer, a charge storage layer, a blocking layer, and/or the like, and at least one of the layers included in the gate dielectric layer 103 may be formed to surround the gate electrode layers 110. The drain region 104 may be connected to at least one of the bitlines BL through the bitline contact 105, and the bitlines BL may be connected to a page buffer formed in the peripheral circuit region PERI.

The cell contact region CTR may include cell contacts CMC connected to the gate electrode layers 110, dummy channel structures DCH, and/or the like. The dummy channel structures DCH may have the same structure as the channel structures CH. However, unlike the channel structures CH, the dummy channel structures DCH may not be connected to the bitlines BL. The gate electrode layers 110 may form a step in at least one of a second direction (an X-axis direction) and a third direction (a Y-axis direction), parallel to the upper surface of the substrate 101 in the cell contact region CTR. The cell contacts CMC may be connected to the gate electrode layers 110, and may be connected to a row decoder formed in the peripheral circuit region PERI by the wordlines 173. The wordlines 173 may be formed in the interlayer insulating layer 180 formed in the cell region CELL and the peripheral circuit region PERI.

The row decoder, formed in the peripheral circuit region PERI, may be disposed to be adjacent to the cell region CELL in the second direction. The row decoder may include high-voltage elements HVTR, operating at a first power supply voltage, and low-voltage elements LVTR operating at a second power supply voltage, lower than the first power supply voltage. The high-voltage elements HVTR may be disposed in a first well region WA1, and the low-voltage elements LVTR may be disposed in a second well region WA2 and a third well region WA3. However, according to example embodiments, the high-voltage elements HVTR may be disposed in a plurality of well regions doped with impurities having different conductivity-types.

The first well region WA1 may be a region doped with impurities having a first conductivity-type, for example, P-type impurities, and the second well region WA2 may be a second well region WA2 having a second conductivity-type different from the first conductivity-type, for example, N-type impurities. The second well region WA2 may surround the first well region WA1, so that the first well region WA1 may be provided as a pocket P-well. The high-voltage elements HVTR illustrated in example embodiments of FIGS. 5 and 6 may be high-voltage NMOS elements. When the high-voltage elements HVTR further include high-voltage PMOS elements, the high-voltage PMOS elements may be formed in the first well region may be formed in a separate well region doped with impurities having the second conductivity-type, unlike the first well region WA1.

At least one of the low-voltage elements LVTR may be formed in the second well region WA2 surrounding the first well region WA1. As an example, the low-voltage elements LVTR formed in the second well region WA2 may be low voltage PMOS elements. Among the low-voltage elements LVTR, low-voltage PMOS elements may be disposed in the second region WA2 surrounding the first well region WA1 provided as a pocket P-well, and thus, the degree of integration of the row decoder and the peripheral circuit area PERI may be increased.

In example embodiments, some of the low-voltage elements LVTR may be formed in the third well region WA3. The third well region WA3 may be a well region doped with impurities having the same first conductivity-type as the first well region WA1, but may have a doping concentration different from that of the first well region WA1. The low-voltage elements LVTR, formed in the third well region WA3, may be low-voltage NMOS elements.

As an example, among the elements HVTR and LVTR included in the row decoder, the high-voltage elements HVTR formed in the first well region WA1 may provide pass elements directly connected to a wordline 173 through a vertical contact VC, and the low-voltage elements LVTR may provide a driver circuit driving the pass elements. In example embodiments, the driver circuit may include a block decoder, a high-voltage switching circuit, a pull-up circuit, and/or the like, and the configuration and operation of the driver circuit will be described later.

Referring to FIG. 6, each of the high-voltage elements HVTR may include a gate structure 130 and a source/drain region 140, and each of the low-voltage elements LVTR may include a gate structure 150 and a source/drain region 160. An element contact 171 and lower interconnections 172 may be connected to the source/drain regions 140 and 160, and the gate structures 130 and 150 may also be connected to the gate contact.

The gate structure 130 of each of the high-voltage elements HVTR may include a high-voltage gate insulating layer 131, a high-voltage gate 132, a gate spacer 133, and/or the like, and the high-voltage gate insulating layer 131 may be disposed between the high-voltage gate 132 and the substrate 101. The gate structure 150 of each of the low-voltage elements LVTR may include a low-voltage gate insulating layer 151, a low-voltage gate 152, and a gate spacer 153, and the low-voltage gate insulating layer 151 may be disposed between the low-voltage gate 152 and the substrate 101.

In example embodiments, the high-voltage gate insulating layer 131 may have a greater thickness than the low-voltage gate insulating layer 151. The high-voltage gate 132 and the low-voltage gate 152 may have the same structure. Accordingly, an upper surface of the high-voltage gate 132 may be disposed to be higher than an upper surface of the low-voltage gate 152, or a portion of the substrate 101 may be recessed in a region in which the high-voltage elements HVTR are formed, so that the upper surface of the high-voltage gate 132 and the upper surface of the low-voltage gate 152 may be disposed at the same height level. A structure, in which the high-voltage elements HVTR and the low-voltage elements LVTR are formed, will be described later.

In example embodiments illustrated in FIGS. 5 and 6, the first well region WA1 may be disposed to be farthest from the cell region CELL in the second direction. However, this is only an example embodiment, and the first well region WA1 may be disposed to be close to the cell region CELL. Hereinafter, this will be described with reference to FIGS. 7 and 8.

Figure 7:
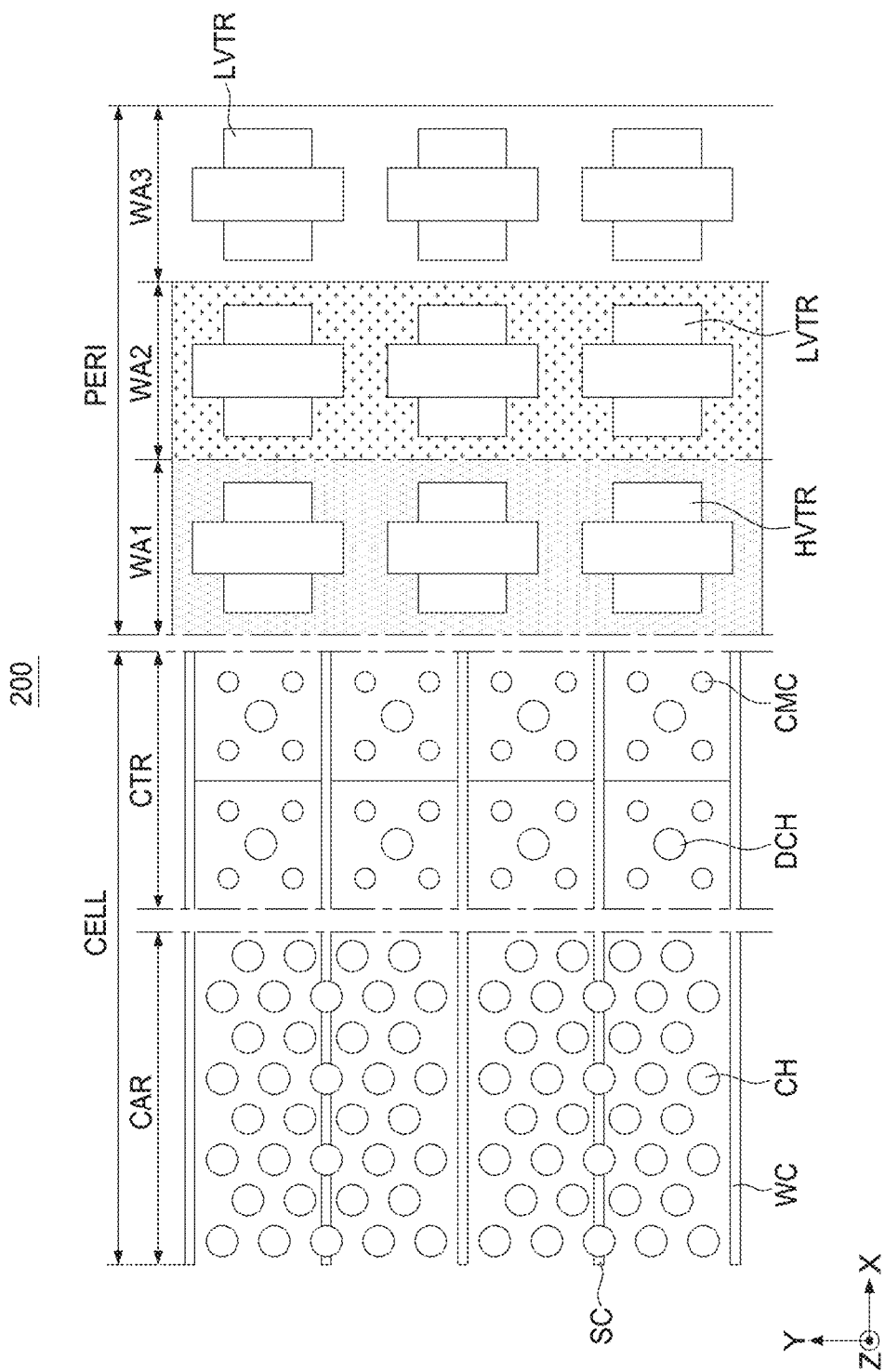
FIG. 7 is a diagram illustrating a structure of a semiconductor device according to example embodiments.
Figure 8:
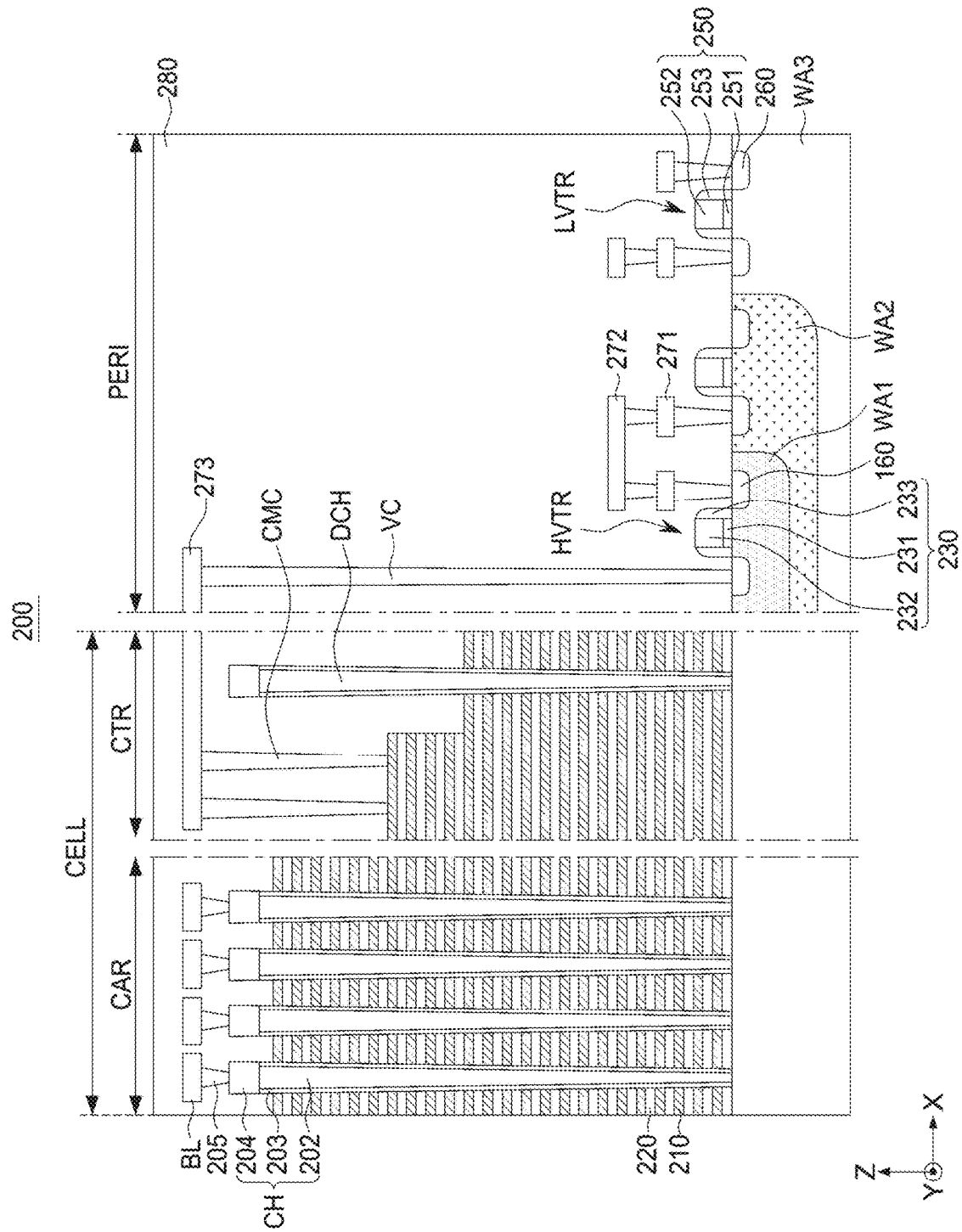
FIG. 8 is a cross-sectional view taken along line II-II' of FIG. 7.

FIG. 7 is a diagram illustrating a structure of a semiconductor device according to example embodiments, and FIG. 8 is a cross-sectional view taken along line II-II' of FIG. 7.

Referring to FIGS. 7 and 8, a structure of a cell region CELL included in a semiconductor device 200 may be similar to the structure described above with reference to FIGS. 5 and 6. As an example, the cell region CELL may include gate electrode layers 210 and insulating layers 220, stacked in a first direction (a Z direction), and channel structures CH connected to a substrate 201 through the gate electrode layers 210 and the insulating layers 220. The channel structures CH may be connected to bitlines BL through bitline contact 205, and each of the channel structures CH may includes a channel layer 202, a gate dielectric layer 203, a drain region 204, and/or the like. The gate electrode layers 210 may be connected to cell contacts CMC, and dummy channel structures CH may be formed between the cell contacts CMC.

In example embodiments illustrated in FIGS. 7 and 8, a first well region WA1 of the peripheral circuit area PERI may be disposed to be close to the cell region CELL. Accordingly, a length of wordlines 273, connecting high-voltage elements HVTR providing pass elements and cell contacts CMC, may be reduced. For example, in example embodiments illustrated in FIGS. 7 and 8, the high-voltage elements HVTR providing pass elements may be disposed between low-voltage elements LVTR providing a driver circuit and the cell region CELL.

In the peripheral circuit region PERI, high-voltage elements HVTR may be formed in the first well region WA1, at least one of the low-voltage elements LVTR may be formed in a second well region WA2 surrounding the first well region WA1, and some of the low-voltage elements LVTR may be formed in a third well region WA3. A configuration of each of the high-voltage elements HVTR and the low-voltage elements LVTR may be similar to that of the example embodiments described above with reference to FIG. 6.

Figure 9:
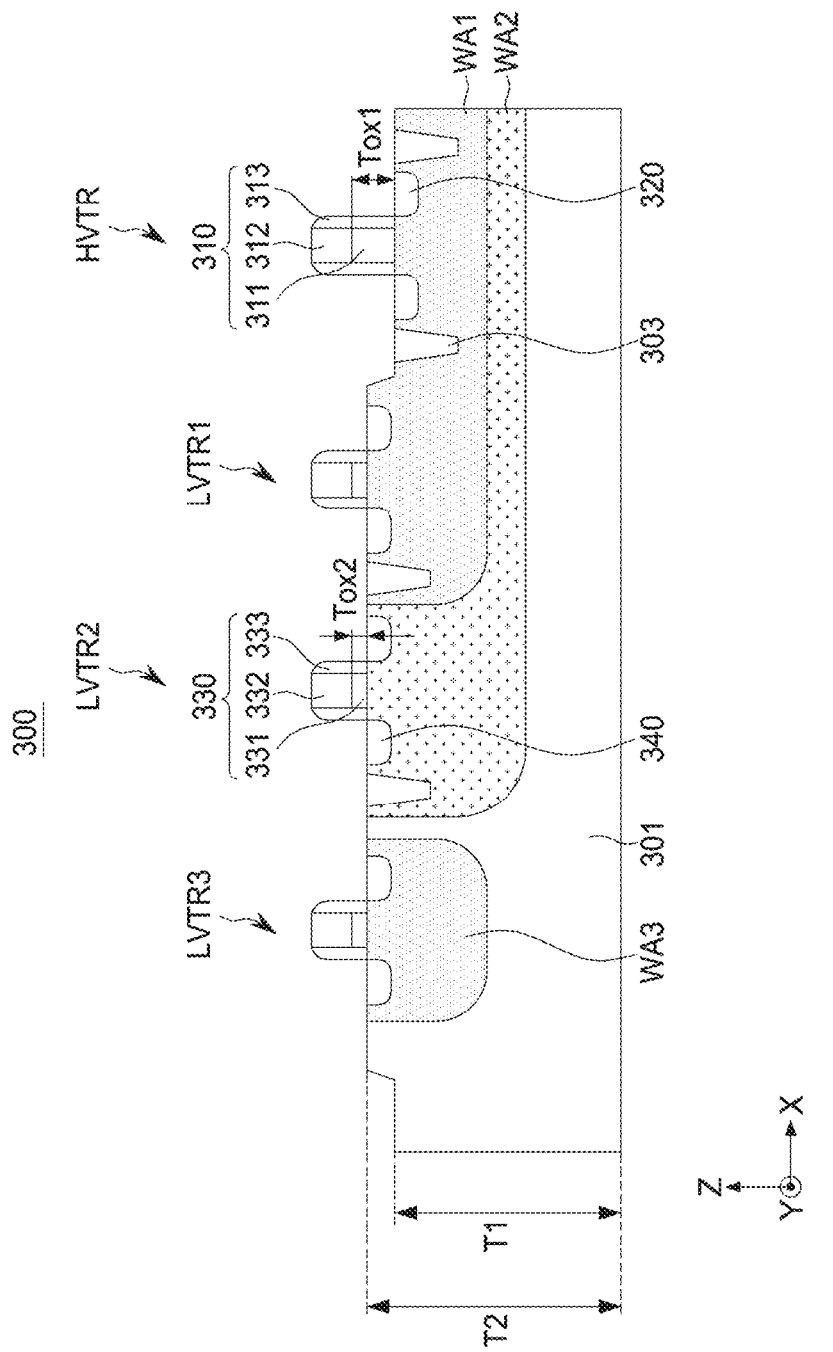
FIGS. 9 to 11 are schematic diagrams illustrating peripheral circuit regions of semiconductor elements according to example embodiments, respectively.
Figure 10:
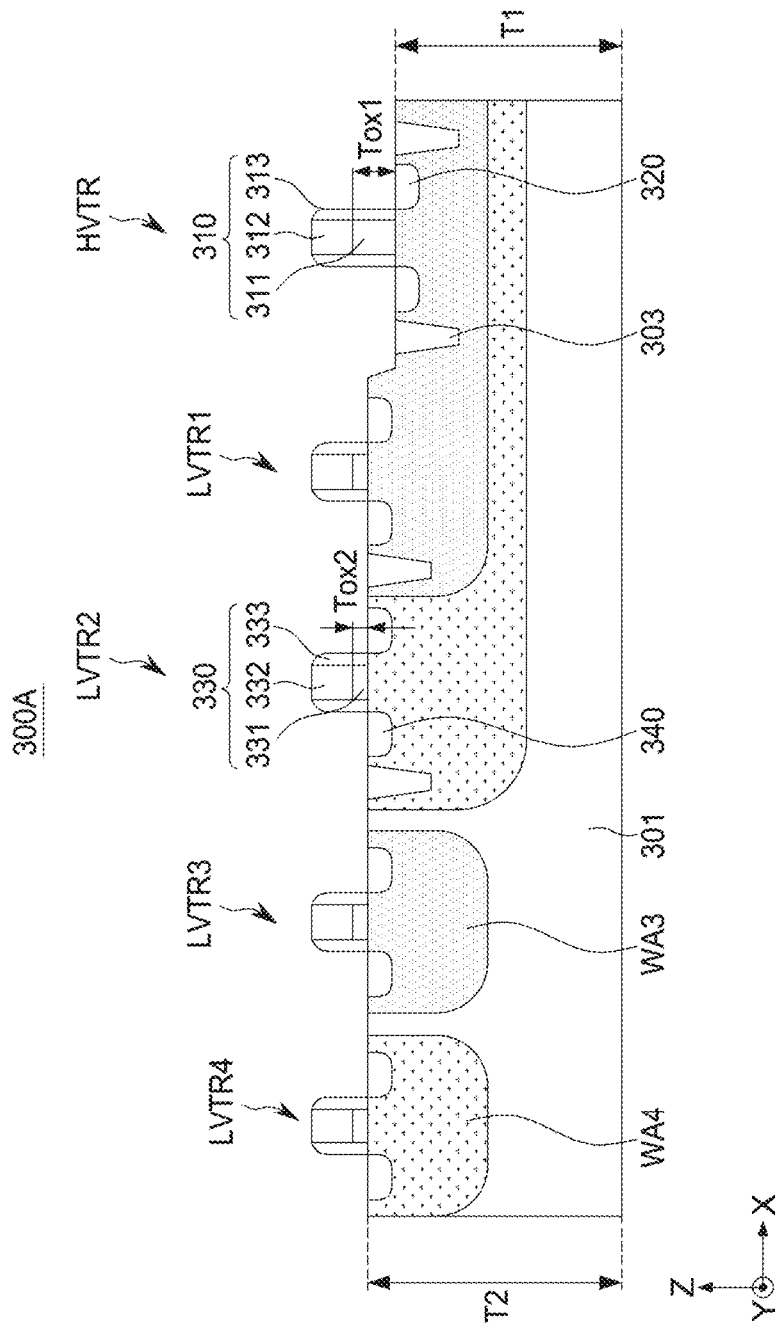
Figure 11:
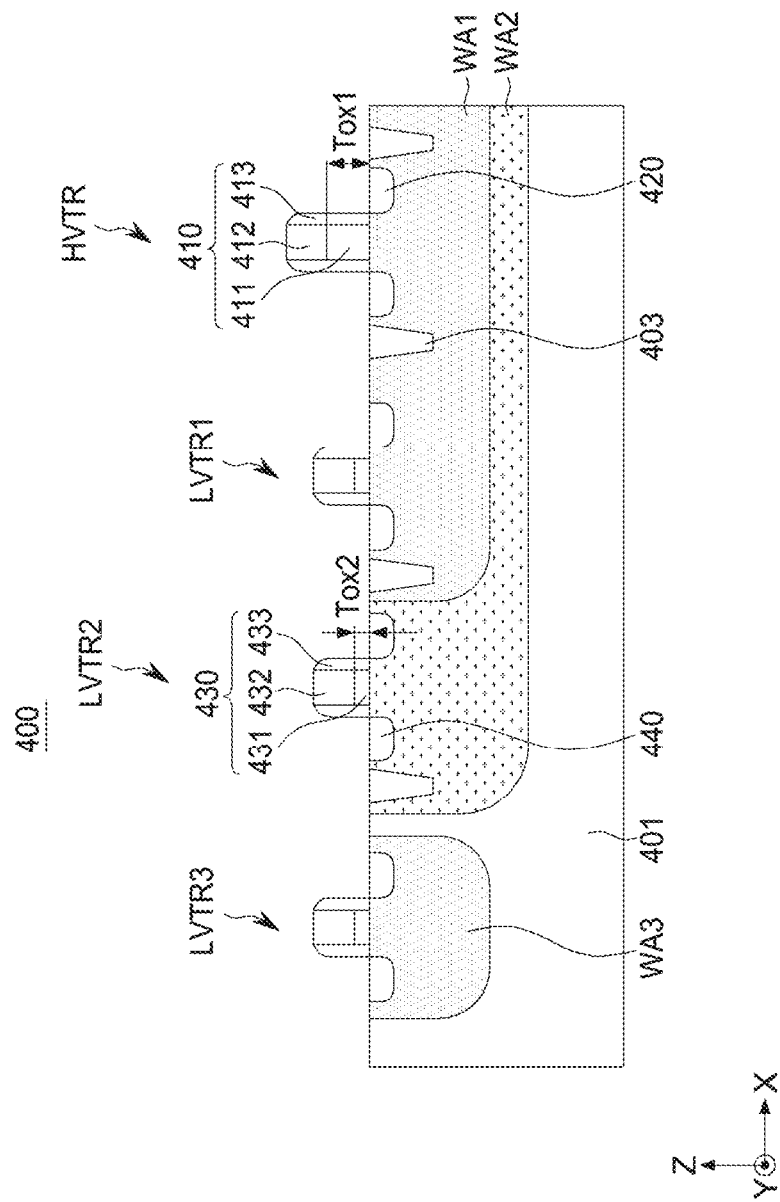

FIGS. 9 to 11 are schematic diagrams illustrating peripheral circuit regions of semiconductor elements according to example embodiments, respectively.

Referring to FIG. 9, a peripheral circuit region of a semiconductor device 300 according to example embodiments may include a plurality of circuit elements HVTR, and LVTR1 to LVTR3. As an example, the plurality of circuit elements HVTR and LVTR1 to LVTR3 may be elements connected to wordlines to provide a row decoder for driving memory cells, and may include a high-voltage element HVTR operating at a first power supply voltage and low-voltage elements LVTR1 to LVTR3 operating at a second power voltage lower than the first power voltage. An element isolation layer 303 may be formed between at least some of the circuit elements HVTR and LVTR1 to LVTR3.

The high-voltage element HVTR may include a gate structure 310 and a source/drain region 320, and the gate structure 310 may include a high-voltage gate insulating layer 311, a high-voltage gate 312, a gate spacer 313, and/or the like. Each of the low-voltage elements LVTR1 to LVTR3 may include a gate structure 330 and a source/drain region 340, and the gate structure 330 may include a high-voltage gate insulating layer 331, a high-voltage gate 332, a gate spacer 333, and/or the like.

The high-voltage element HVTR may be disposed in the first well region WA1 doped with impurities having a first conductivity-type, and the first well region WA1 may be a region doped with P-type impurities. The first well region WA1 may be a pocket P-well region surrounded by the second well region WA2, and the second well region WA2 may be doped with impurities having a second conductivity-type. The impurities having the second conductivity-type impurity may be N-type impurities.

Among the low-voltage elements LVTR1 to LVTR3, the first low-voltage element LVTR1 may be disposed in the first well region WA1, and the second low-voltage element LVTR2 may be disposed in the second well region WA2. Since the first low-voltage element LVTR1 is also disposed in the first well region WA1 in addition to the high-voltage element HVTR, a thickness of a gate insulating layer included in at least one of the NMOS elements HVTR and LVTR1 formed in the first well region WA1 may be the same as a thickness of a gate insulating layer included in the second low-voltage element LVTR2 formed in the second well region WA2.

As described above, the low-voltage gate insulating layer 331 may have a relatively small thickness, as compared with a thickness of the high-voltage gate insulating layer 311. Referring to FIG. 9, the first well region WA1 may have a first thickness T1 in a region in which the high-voltage element HVTR is disposed, and may have a second thickness T2, greater than the first thickness T1, in a region in which the first low-voltage element LVTR1 is disposed.

As an example, a difference between the first thickness T1 and the second thickness T2 may correspond to a difference between a thickness $T_{OX1}$ of the high-voltage gate insulating layer 311 and a thickness $T_{OX2}$ of the low-voltage gate insulating layer 331. Therefore, an upper surface of the high-voltage gate insulating layer 311 and an upper surface of the low-voltage gate insulating layer 331 may be disposed on the same height level. In example embodiments, a peripheral circuit region may be formed as illustrated in FIG. 10 by removing a portion of the substrate 301 in a region, in which the high-voltage element HVTR is to be formed, and forming the well regions WA1 to WA3 and the circuit elements HVTR and LVTR1 to LVTR3.

The third low-voltage element LVTR3 may be disposed in the third well region WA3. The third well region WA3 may be a region separated from the first well region WA1 and the second well region WA2 and may be doped with impurities having the same first conductivity-type as the first well region WA1. However, an impurity doping concentration of the third well region WA3 may be different from an impurity doping concentration of the first well region WA1. In addition, a negative voltage may be input to the first well region WA1 as a body bias voltage of the high-voltage element HVTR and the first low-voltage element LVTR1, and a ground voltage may be applied to the third well region WA3 as a body bias voltage of the third low-voltage element LVTR3.

Since a negative voltage is input to the first well region WA1, the first low-voltage element LVTR1 may be selected as an element in which a body bias voltage is a negative voltage, among low-voltage NMOS elements included in a row decoder. As an example, the first low-voltage element LVTR1 may be an element included in a high-voltage switching circuit.

Referring to FIG. 10, a peripheral circuit region of a semiconductor device 300A according to example embodiments may include a plurality of circuit elements HVTR and LVTR1 to LVTR4. The plurality of circuit elements HVTR and LVTR1 to LVTR4 may be elements providing a row decoder connected to wordlines, and may further include a fourth low-voltage element LVTR4, as compared with the example embodiments illustrated in FIG. 9.

The fourth low-voltage element LVTR4 may be formed in a fourth well region WA4 separated from first to third well regions WA1 to WA3, and the fourth well region WA4 may be doped with impurities having the same second conductivity-type as the second well region WA2. Accordingly, the fourth low-voltage element LVTR4 may be a low-voltage PMOS element. An impurity concentration of the fourth well region WA4 may be the same as or different from an impurity concentration of the second well region WA2. As an example, the impurity concentration of the fourth well region WA4 may be higher than the impurity concentration of the second well region WA2.

In the example embodiments described with reference to FIGS. 9 and 10, the substrate 301 may have a first thickness T1 in a region in which the high-voltage element HVTR is formed, and may have a second thickness T2, greater than the first thickness T1, in another region. As illustrated in FIGS. 9 and 10, a lower surface of the first well region WA1 may be formed on the same height level as lower surfaces of the third well region WA3 and the fourth well region WA4, and a lower surface of the second well region WA2 may be disposed to be relatively lower. Also, a thickness of the first well region WA1 in the region, in which the high-voltage element HVTR is formed, may be smaller than a thickness of the first well region WA1 in the region in which the first low-voltage element LVTR1 is formed. However, this is only an example, and the lower surface of the first well region WA1 may be formed in a relatively lower position in the region in which the high-voltage element HVTR is formed, depending on a method of fabricating the semiconductor device 300, or the like.

Referring to FIG. 11, a peripheral circuit region of a semiconductor device 400 according to example embodiments may include a plurality of circuit elements HVTR and LVTR1 to LVTR3. The plurality of circuit elements HVTR and LVTR1 to LVTR3 may be elements providing a row decoder connected to wordlines.

Unlike the example embodiments illustrated in FIGS. 9 and 10, in example embodiments illustrated in FIG. 11, the substrate 301 may have a uniform thickness. Accordingly, an upper surface of the substrate 301 may not have a step in the region in which the high-voltage element HVTR is formed and a region in which the low-voltage elements LVTR1 to LVTR3 are formed. Accordingly, the first well region WA1 may also have a uniform thickness.

As described above, the high-voltage gate insulating layer 411 included in the high-voltage element HVTR may have a greater thickness than the low-voltage gate insulating layer 431 included in each of the low-voltage elements LVTR1 to LVTR3. Referring to FIG. 11, the first thickness $T_{OX1}$ of the high-voltage gate insulating layer 411 may be greater than the second thickness $T_{OX2}$ of the low-voltage gate insulating layer 431, and thus, an upper surface of the high-voltage gate insulating layer 411 may be disposed to be higher than the top surface of the low-voltage gate insulating layer 431. In addition, since the high-voltage gate 412 and the low-voltage gate 432 have the same structure, the upper surface of the high-voltage gate 412 may be disposed to be higher than the upper surface of the low-voltage gate 432.

Referring to FIGS. 9 to 11, in one direction (an X-axis direction) parallel to the upper surfaces of the substrates 301 and 401, the first low-voltage element LVTR1 may be formed between the high-voltage element HVTR, formed in the first well region WA1, and the second low-voltage elements LVTR2 formed in the well region WA2. Also, the first low-voltage element LVTR1 may be disposed to be closer to a boundary between the first well region WA1 and the second well region WA2 than the high-voltage element HVTR. However, this is only an example, and the arrangement of the elements may be variously changed. As an example, the high-voltage element HVTR may be disposed to be closer to the boundary between the first well region WA1 and the second well region WA2 than the first low-voltage element LVTR1.

Figure 12:
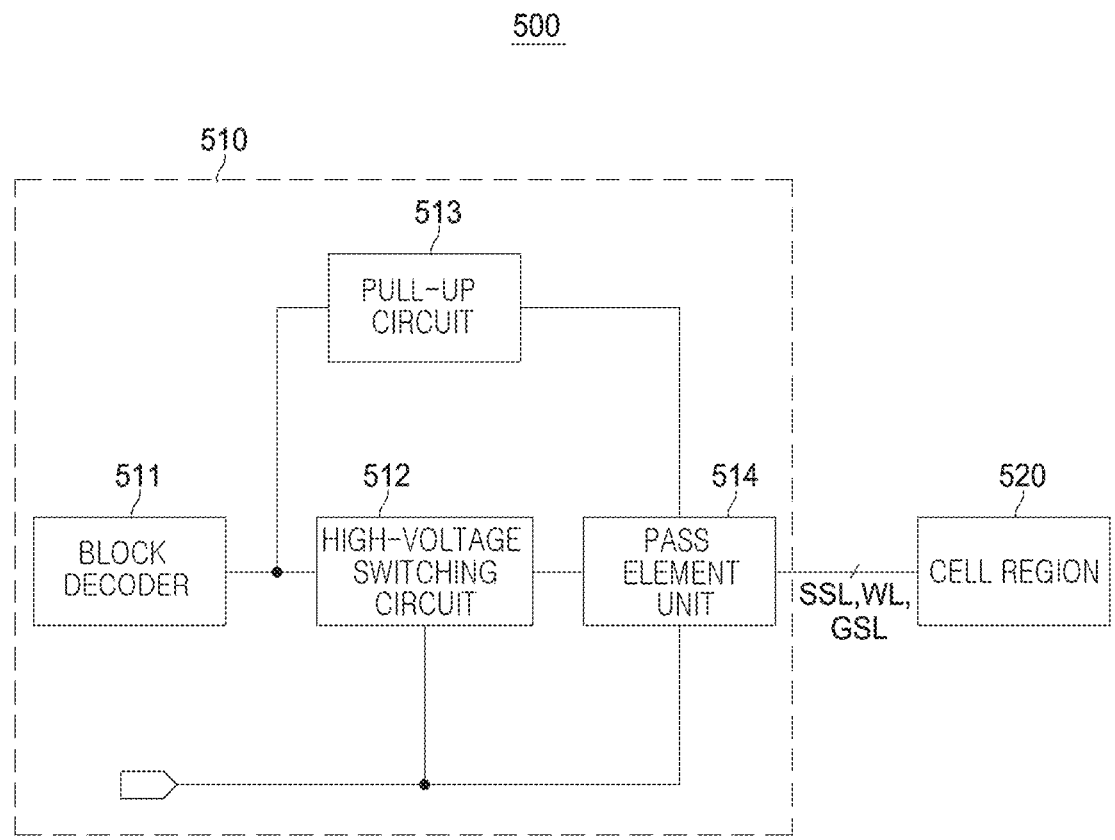
FIG. 12 is a schematic block diagram illustrating a row decoder according to example embodiments.

FIG. 12 is a schematic block diagram illustrating a row decoder according to example embodiments.

Referring to FIG. 12, in a semiconductor device 500 according to example embodiments, a row decoder 510 may be connected to a cell region 520 through a ground select lines GSL, wordlines WL, and/or string select lines SSL. As an example, the row decoder 510 may be electrically connected to gate electrodes of memory cells included in the cell region 520 through the ground select lines GSL, the wordlines WL, and the string select lines SSL.

The row decoder 510 may include a block decoder 511, a high-voltage switching circuit 512, a pull-up circuit 513, and/or a pass element unit 514. The block decoder 511 may be a circuit selecting a single memory block in the cell region 520. The high-voltage switching circuit 512 may increase a level of a logic value, output from the block decoder 511, to output a block select signal, and pass elements included in the pass element unit 514 may be switched by the block select signal.

The pass element unit 514 may include a plurality of pass elements connected to the cell region 520 through ground select lines GSL, the wordlines WL, and the string select lines SSL. In general, voltages supplied to the cell region 520 by the pass elements may have a relatively high level, as compared with a voltage for driving a circuit. Accordingly, the pass elements may be implemented as high-voltage elements which may endure a relatively high level of voltage, and the gate insulating layer of each of the pass elements may have a relatively great thickness to endure a high voltage difference between a gate structure and a source/drain region. The pull-up circuit 513 may input a high voltage to gates of the pass elements in response to a signal output from the block decoder 511.

A negative voltage Vneg may be input to the high-voltage switching circuit 512 and the pass element unit 514. As an example, the negative voltage Vneg may be input to at least some of the elements, included in the high-voltage switching circuit 512 and the pass element unit 514, as a body bias voltage.

In example embodiments, high-voltage NMOS elements providing pass elements may be formed in a first well region doped with p-type impurities and formed as a pocket P-well region. In addition, at least one of the low-voltage NMOS elements, included in the high-voltage switching circuit 512 and receiving the negative voltage Vneg as a body bias voltage, may be formed together in the first well region. At least one of the low-voltage PMOS element may be formed in a second well region, surrounding the first well region and doped with N-type impurities, to increase the degree of integration of circuit elements included in the row decoder 510 and to shorten a connection path between the circuit element, so that performance of the semiconductor device 500 may be improved.

Figure 13:
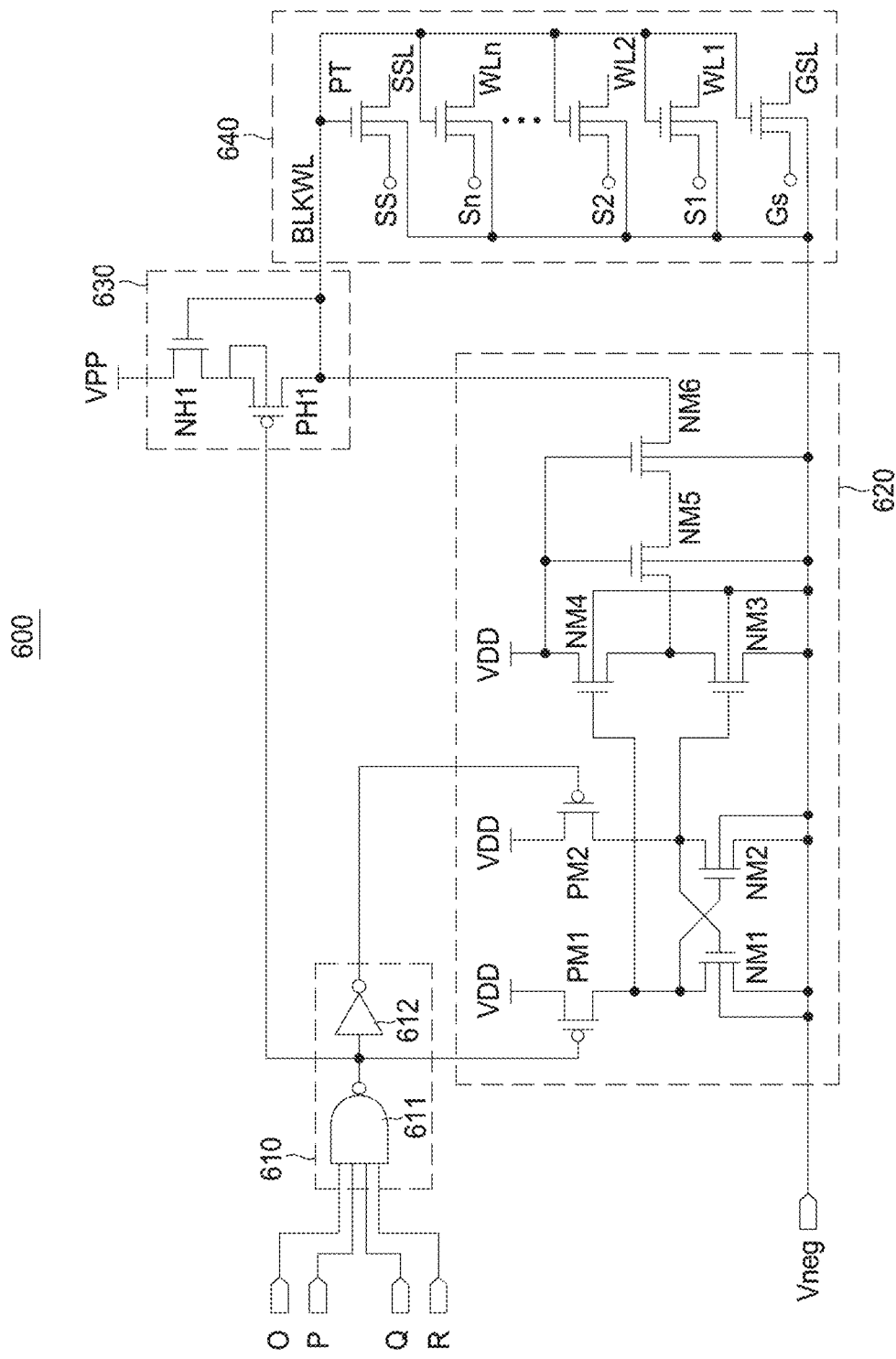
FIG. 13 is a schematic circuit diagram of a row decoder according to example embodiments.
Figure 14:
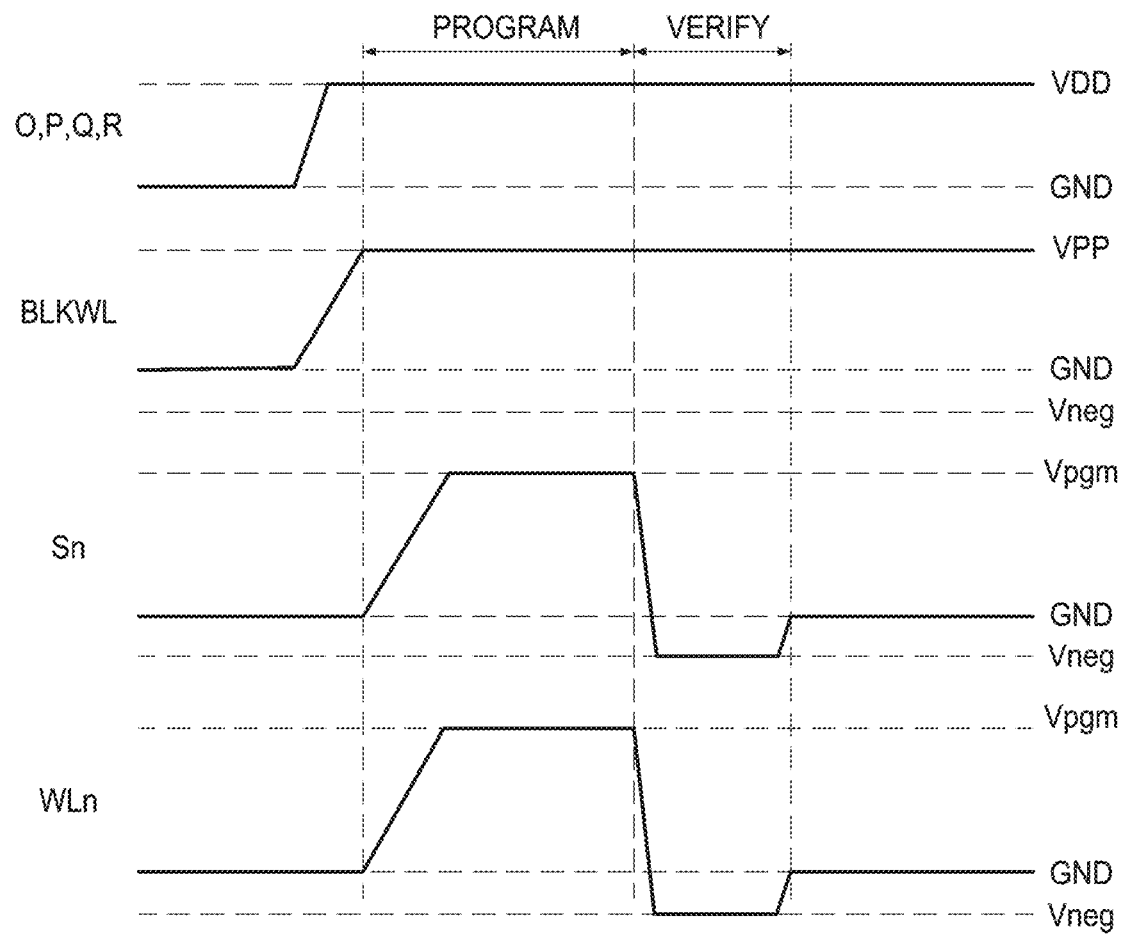
FIG. 14 is a timing diagram illustrating an operation of the row decoder illustrated in FIG. 13.

FIG. 13 is a schematic circuit diagram of a row decoder according to example embodiments, and FIG. 14 is a timing diagram illustrating an operation of the row decoder illustrated in FIG. 13.

Referring first to FIG. 13, a row decoder 600 may include a block decoder 610, a high-voltage switching circuit 620, a pull-up circuit 630, a pass element unit 640, and/or the like. The block decoder 610 may include a NAND gate 611 and/or an inverter 612, and may perform a NAND logic operation on decoded signals O, P, Q, and R provided by a row address. As an example, the block decoder 610 may further include a circuit determining whether a block selected from a row address is a bad block and interrupting an output of the NAND gate. The inverter 612 may invert the output of the NAND gate 611.

The high-voltage switching circuit 620 may operate in response to an output signal of the NAND gate 611 and the inverter 612. The high-voltage switching circuit 620 may include PMOS elements PM1 and PM2, NMOS elements NM1 to NM5, and/or a depletion mode NMOS element NM6.

As an example, when the output of the NAND gate 611 has a low level, the first PMOS element PM1 may be turned on and the second PMOS element PM2 may be turned off. Accordingly, the low power voltage VDD may be input to a gate of each of the second NMOS element NM2 and the fourth NMOS element NM4, and the second NMOS element NM2 and the fourth NMOS element NM4 may be turned on. Thus, a low power supply voltage VDD may be input to a node between the third NMOS element NM3 and the fourth NMOS element NM4.

When a voltage on a node between the third NMOS element NM3 and the fourth NMOS element NM4 may increase to a threshold voltage of the depletion mode NMOS element NM6, the depletion mode NMOS element NM6 may be shut off. Accordingly, when the output of the NAND gate 611 is in a low level state, the high-voltage switching circuit 620 may be electrically separated from a block wordline BLKWL to which the gates of the pass elements PT are connected. In some example embodiments, the pass elements PT may be turned on by a high power supply voltage VPP input to the block wordline BLKWL by the pull-up circuit 630.

In contrast, when the output of the NAND gate 611 is in a high level state, the high-voltage switching circuit 620 may be connected to the block wordline BLKWL. When the output of the NAND gate 611 is in a high level state, the first PMOS element PM1 may be turned off while an output of the inverter 612 has a low level, so that the second PMOS element PM2 may be turned on. Accordingly, the low power supply voltage VDD may be input to a gate of each of the first NMOS element NM1 and the third NMOS element NM3 to turn on the first NMOS element NM1 and the third NMOS element NM3.

Since the third NMOS element NM3 is turned on, the negative voltage Vneg may be input to the node between the third NMOS element NM3 and the fourth NMOS element NM4, unlike example embodiments in which the output of the NAND gate 6111 is in a low level state. The negative voltage Vneg may be input to the block wordline BLKWL through the depletion mode element NM6. As an example, when a voltage on the block wordline BLKWL is a ground voltage, the negative voltage Vneg may be input to the block wordline BLKWL through the depletion mode element NM6. When the voltage on the block wordline BLKWL is a high power supply voltage VPP, the voltage on the block wordline BLKWL may be discharged through the depletion mode element NM6.

The negative voltage Vneg may be input to the body of the pass elements PT as a bias voltage. When the output of the NAND gate 611 is in a high level state, a voltage on the block wordline BLKWL connected to the gates of the pass elements PT by the high-voltage switching circuit 620 may decrease to a negative voltage Vneg, so that the pass elements PT may be turned off. According to example embodiments, the negative voltage Vneg may be supplied to at least one of the string select line SSL and the ground select line GSL. In the high-voltage switching circuit 620, the PMOS elements PM1 and PM2 and the first to fourth NMOS elements NM1 to NM4 may operate as a level shifter.

The pull-up circuit 630 may be connected between the high power supply voltage VPP and the block wordline BLKWL, and may input the high power supply voltage VPP to the block wordline BLKWL in response to the output of the NAND gate 611. Referring to FIG. 13, the pull-up circuit 630 may include a depletion mode element NH1 and a high-voltage PMOS element PH1. A drain of the depletion mode element NH1 may receive the high power supply voltage VPP, and a gate of the depletion mode element NH1 may be connected to the block wordline BLKWL. A drain of the high-voltage PMOS element PH1 may be connected to the block wordline BLKWL, and a gate of the high-voltage PMOS element PH1 may be connected to an output terminal of the NAND gate 611.

When the output of the NAND gate 611 is in a low level state, the high-voltage PMOS element PH1 may be turned on and a threshold voltage of the depletion mode element NH1 may be input to the block wordline BLKWL. Accordingly, the voltage on the block wordline BLKWL may increase. The voltage on the block wordline BLKWL may be input to the gate of the depletion mode element NH1 to turn on the depletion mode element NH1. As a result, the high power supply voltage VPP may be input to the block wordline BLKWL. As described above, when the output of the NAND gate 611 is in a low level state, the high-voltage switching circuit 620 may be separated from the block wordline BLKWL, so that the negative voltage Vneg may not be input to the block wordline BLKWL. Accordingly, the pass elements PT may be turned on by the high power supply voltage VPP input to the block wordline BLKWL.

When the output of the NAND gate 611 is in a high level state, the high-voltage PMOS element PH1 may be turned off and the high-voltage VPP may not be input to the block wordline BLKWL. As described above, when the output of the NAND gate 611 is in a high level state, the high-voltage switching circuit 620 may be connected to the block wordline BLKWL and the negative voltage Vneg may be input to the block wordline BLKWL, so that the pass elements PT may be turned off by the negative voltage Vneg input to the line block wordline BLKWL.

In the circuit diagram illustrated in FIG. 13, a negative voltage Vneg may be input, as a bias voltage, to a body of some NMOS elements, for example, the pass elements PT and the first to fifth NMOS elements NM1 to NMS. According to example embodiments, the first to fifth NMOS elements NM1 to NM5 may be high-voltage NMOS elements or low-voltage NMOS elements. When the first to fifth NMOS elements NM1 to NM5 are high-voltage NMOS elements, the first to fifth NMOS elements NM1 to NM5 may be formed together with the pass elements PT in a single pocket P-well region.

In example embodiments, even when the first to fifth NMOS elements NM1 to NM5 included in the high-voltage switching circuit 620 are low-voltage NMOS elements, the pass elements PT, high-voltage NMOS elements, and the first to fifth NMOS elements NM1 to NM5, low-voltage NMOS elements, may be formed in a single pocket P-well region, as described above with reference to FIGS. 5 to 11. Thus, an area of a region in which the row decoder 600 is disposed may be reduced, and the degree of integration of a semiconductor device including the row decoder 600 may be improved.

For example, referring to FIG. 9, the high-voltage element HVTR formed in the first well region WA1, a pocket P-well region, may be one of the pass elements PT, and the first low-voltage element LVTR1 formed in the first well region WA1 may be one of the first to fifth NMOS elements NM1 to NM5. In addition, the second low-voltage element LVTR2 formed in the second well region WA2 surrounding the first well region WA1 may be one of the PMOS elements PM1 and PM2 of the high-voltage switching circuit 620, and the third low-voltage element LVTR3 formed in the third well region WA3 may be a PMOS element included in the inverter 612.

FIG. 14 may be a timing diagram illustrating an operation of the row decoder 600 illustrated in FIG. 13. Referring to FIG. 14, decoding signals O, P, Q, and R input to the NAND gate 611 of the block decoder 610 may have a high level during a program operation. The high level of the decoding signals O, P, Q, and R may be a low power supply voltage VDD. Accordingly, the output of the NAND gate 611 may have a low level, and a memory block connected to the row decoder 600 may be selected.

As described above, when the output of the NAND gate 611 is in a low level state, the high-voltage switching circuit 620 may be separated from the block wordline BLKWL by the depletion mode element NM6, and thus, a negative voltage Vneg may not be input to the block wordline BLKWL. On the other hand, since the output of the NAND gate 611 is in a low level state, the high power supply voltage VPP may be input to the block wordline BLKWL by the pull-up circuit 630 and the pass elements PT may be turned on. In this case, the negative voltage Vneg may be input to the body of the pass elements PT, as a bias voltage.

When the pass elements PT are turned on, a program voltage Vpgm may be input to a selected wordline WLn as a selected wordline signal Sn for a program operation. When the program operation for inputting the program voltage Vpgm is completed, a verify operation may be performed. During the verification operation, a level of the selected wordline signal Sn input to the selected wordline WLn may be a negative voltage Vneg.

Figure 15:
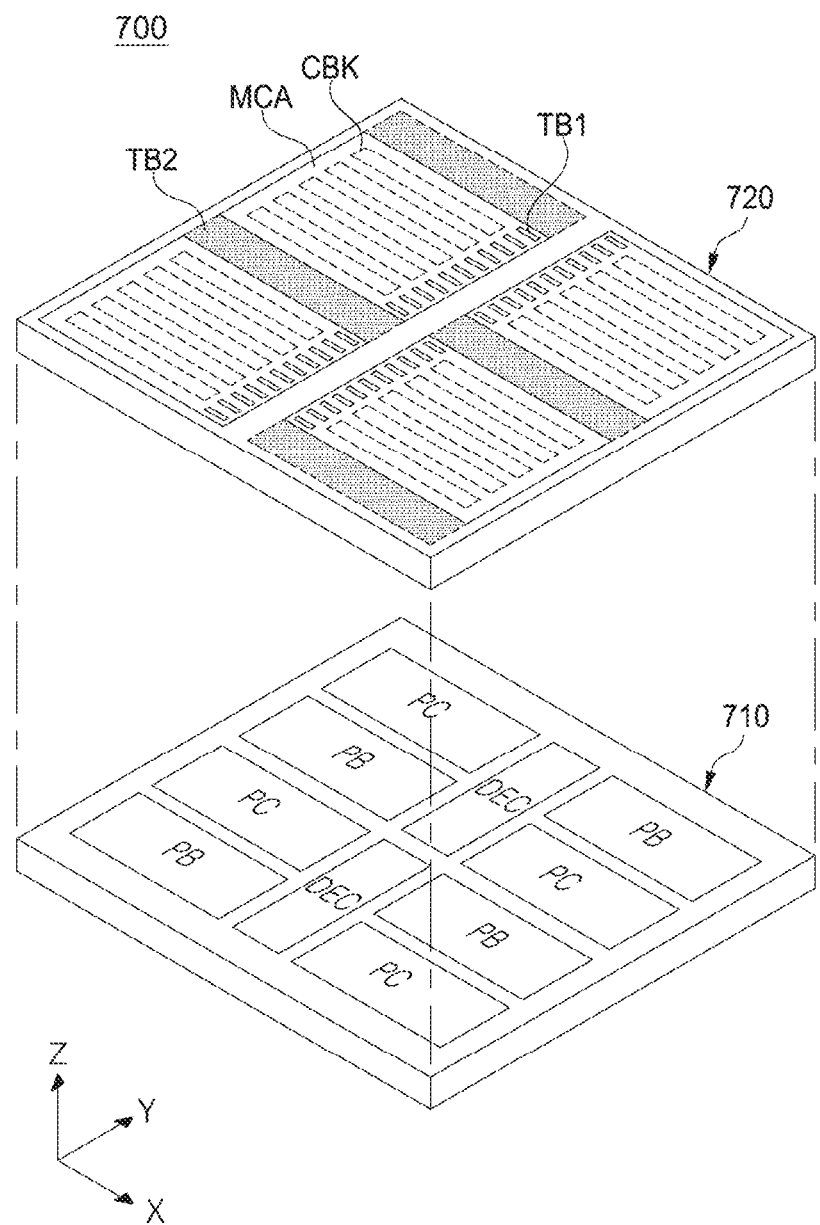
FIG. 15 is a schematic diagram illustrating a structure of a semiconductor device according to example embodiments.

FIG. 15 is a schematic diagram illustrating a structure of a semiconductor device according to example embodiments.

Referring to FIG. 15, a semiconductor device 700 may include a first region 710 and a second region 720 stacked in a first direction (a Z-axis direction). The first region 710 may be a peripheral circuit region, and may include a row decoder DEC, a page buffer PB, and/or a peripheral circuit PC formed on a first substrate. As an example, the peripheral circuit PC may include a voltage generator, a source driver, an input/output circuit, and/or the like.

The second region 720 may be a cell region, and may include memory cell arrays MCA and first and second through-interconnection regions TB1 and TB2 formed on a second substrate. Through-interconnections, connecting the first region 710 and the second region 720 to each other and extending in a vertical direction, may be disposed in each of the first and second through-interconnection regions TB1 and TB2. Cell blocks CBK, included in each of the memory cell arrays MCA, may extend in a second direction (an X-axis direction) and may be arranged in a third direction (a Y-axis direction). According to example embodiments, at least one dummy block may be disposed between at least some of the cell blocks CBK.

The first region 710 may include a plurality of circuit elements for implementing a row decoder DEC, a page buffer PB, a peripheral circuit PC, and/or the like, included in a peripheral circuit region, and interconnection patterns connecting the circuit elements to each other. The circuit elements may be divided into low-voltage elements and high-voltage elements. However, according to example embodiments, elements operating at a power supply voltage, different from a low power supply voltage input to the low-voltage elements and a high power supply voltage input to the high-voltage element, may be further provided.

In the first region 710, among the high-voltage elements, high-voltage NMOS elements may be surrounded by an N-well region doped with N-type impurities and may be formed in a pocket P-well region doped with P-type impurities. In example embodiments, at least one of the low-voltage NMOS elements included in the low-voltage elements may be formed in the pocket P-well region together with the high-voltage NMOS elements. The high-voltage NMOS elements and the low-voltage NMOS elements formed together in the pocket P-well region may receive the same body bias voltage.

A gate insulating layer of each of the low-voltage NMOS elements may have a thickness smaller than a thickness of a gate insulating layer of each of the high-voltage NMOS element. Accordingly, when a low-voltage NMOS element is formed together with the high-voltage NMOS elements in a pocket P-well region having a planar upper surface, gate upper surfaces of the high-voltage NMOS elements may be disposed on a higher level than a gate upper surface of the low-voltage NMOS element. Alternatively, a portion of a substrate may be removed in advance in a region in which the high-voltage NMOS elements are formed, allowing gate upper surfaces of the high-voltage NMOS element and a gate surface of the low-voltage NMOS element to be formed on the same or substantially the same height level.

Figure 16:
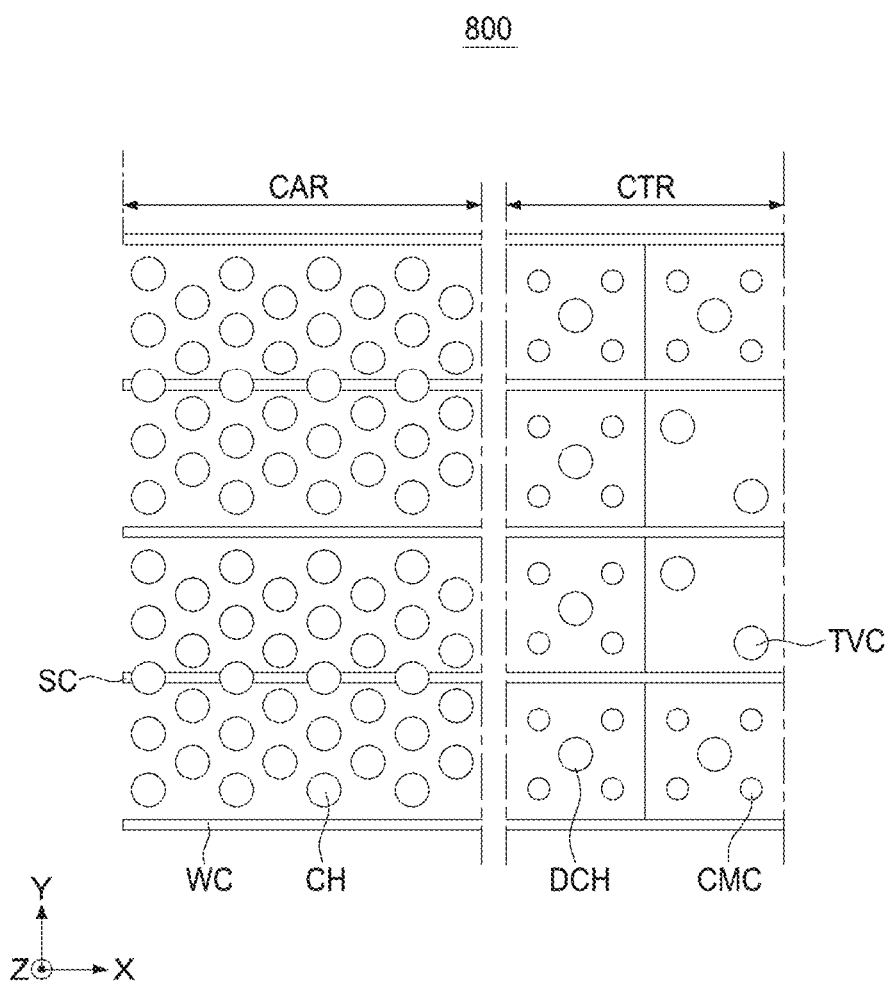
FIG. 16 is a diagram illustrating a structure of a semiconductor device according to example embodiments.
Figure 17:
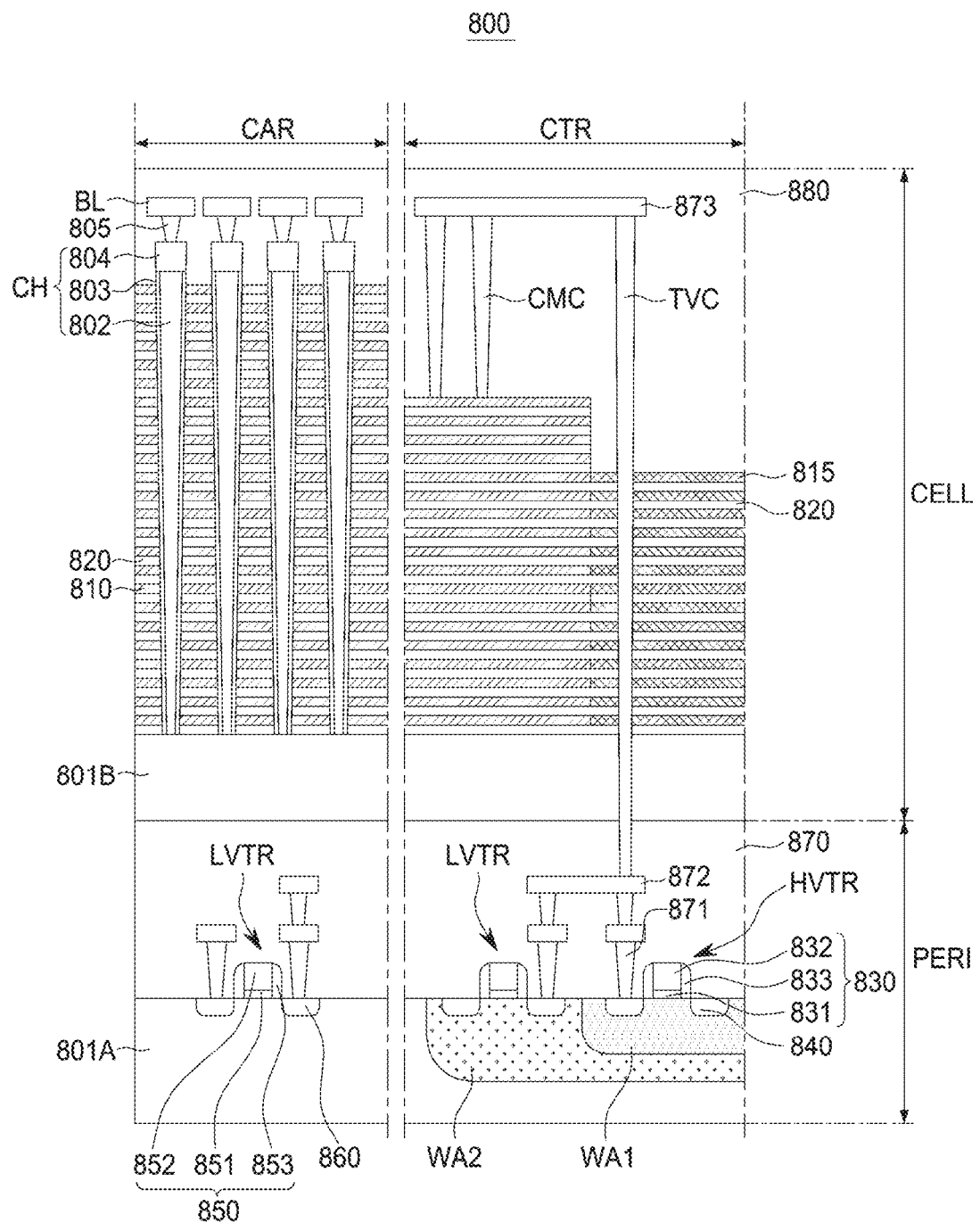
FIG. 17 is a cross-sectional view taken along line III-III' of FIG. 16.

FIG. 16 is a diagram illustrating a structure of a semiconductor device according to example embodiments, and FIG. 17 is a cross-sectional view taken along line of FIG. 16.

Referring to FIGS. 16 and 17, a cell region CELL and a peripheral circuit region PERI may be stacked in a first direction (a Z-axis direction). A cell region CELL of a semiconductor device 800 may include a cell array region CAR and a cell contact region CTR. As an example, the cell array region CAR may be a region in which channel structures CH are disposed, and the cell contact region CTR may be a region in which cell contacts CMS are disposed.

The peripheral circuit region PERI may include a first substrate 801A, a plurality of circuit elements HVTR and LVTR formed on the first substrate 801A, and/or interconnection patterns 871 and 872 connected to the plurality of circuit elements HVTR and LVTR. The plurality of circuit elements HVTR and LVTR may include high-voltage elements HVTR and low-voltage elements LVTR, and the interconnection patterns 871 and 872 may include an element contact 871 and lower interconnections 872.

The high-voltage element HVTR may operate at a relatively high power supply voltage, and may include a gate structure 830 and a source/drain region 840. The low-voltage element LVTR may operate at a relatively low power supply voltage, and may include a gate structure 850 and a source/drain region 860. The gate structure 830 of the high-voltage element HVTR may include a high-voltage gate insulating layer 831, a high-voltage gate 832, a gate spacer 833, and/or the like. The gate structure 850 of the low-voltage element LVTR may include a low-voltage gate insulating layer 851, a low-voltage gate 852, a gate spacer 853, and/or the like.

The high-voltage gate insulating layer 831 may have a thickness greater than a thickness of the low-voltage gate insulating layer 851, and the high-voltage gate 832 and the low-voltage gate 852 may have the same structure. Accordingly, an upper surface of the high-voltage gate 832 may be disposed on a higher level than an upper surface of the low-voltage gate 852. Alternatively, a portion of the first substrate 801A may be removed to form a recess region in a region in which the high-voltage element HVTR is formed, allowing an upper surface of the high-voltage gate 832 and an upper surface of the low-voltage gate 852 to be disposed on the same height level.

The cell array region CAR may include gate electrode layers 810 and insulating layers 820 stacked in a first direction, perpendicular to an upper surface of the second substrate 801B, channel structures CH penetrating through the gate electrode layers 810 and the insulating layers 820, and/or the like. A configuration of each of the channel structures CH may be similar to that described above with reference to FIG. 6.

The cell contact region CTR may include cell contacts CMC and a through-interconnection TVC connected to the gate electrode layers 110. In a region in which the through-interconnection TVC is disposed, sacrificial layers 115 may remain without being replaced with the gate electrode layers 110. Accordingly, the through-interconnection TVC may be separated from the gate electrode layers 110 and may penetrate through the sacrificial layers 115 and the insulating layers 120 to be connected to the circuit elements HVTR and LVTR of the peripheral circuit region PERI disposed below the cell contact region CTR. In the example embodiments illustrated in FIG. 17, a high-voltage element HVTR having a source/drain region connected to the through-interconnection TVC may be a single pass element, among pass elements included in a row decoder in the peripheral circuit region PERI.

Figure 18:
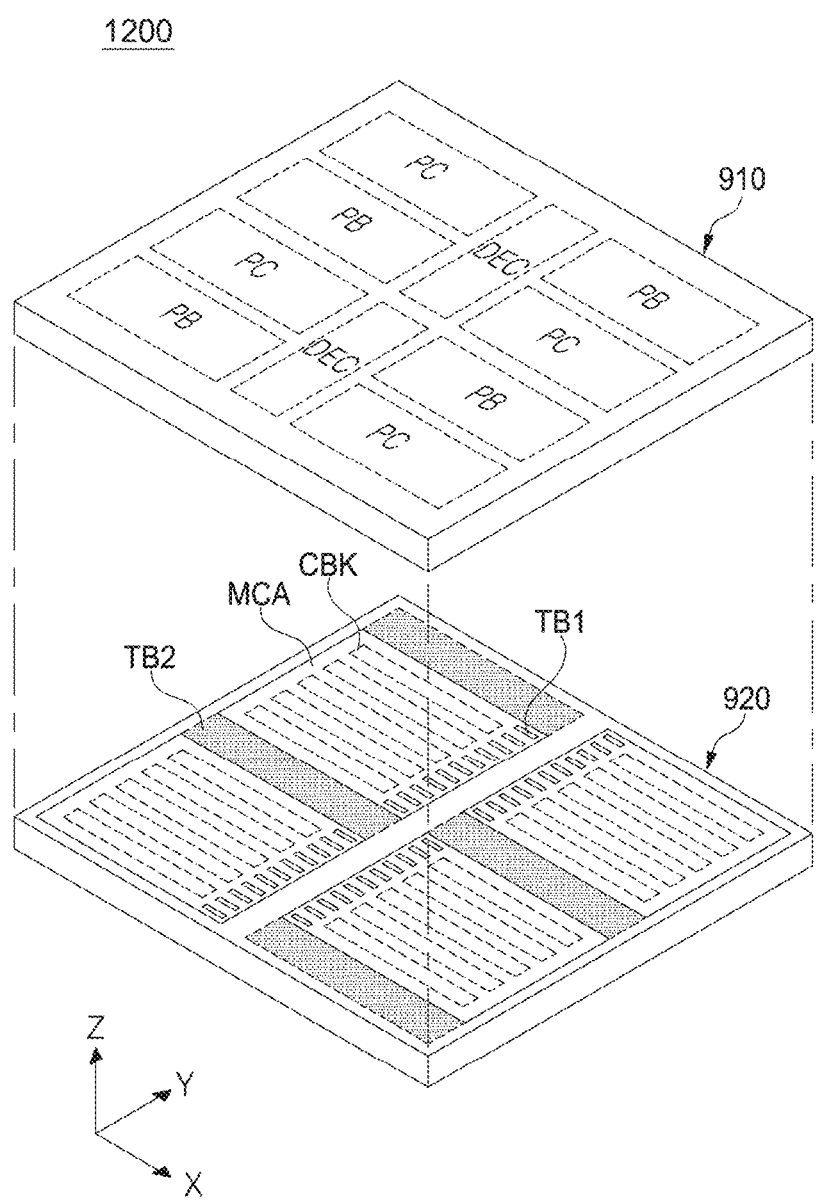
FIG. 18 is a schematic diagram illustrating a structure of a semiconductor device according to example embodiments.

FIG. 18 is a schematic diagram illustrating a structure of a semiconductor device according to example embodiments.

Referring to FIG. 18, a semiconductor device 900 may include a first region 910 and a second region 920 stacked in a first direction (a Z-axis direction). The first region 910 may be a peripheral circuit region, and the second region 920 may be a cell region. A configuration of each of the first region 910 and the second region 920 may be similar to that described above with reference to FIG. 15.

Unlike the example embodiments described above with reference to FIG. 15, in example embodiments illustrated in FIG. 18, the first region 910 including the peripheral circuit region may be coupled to the second region 920 while being inverted. Accordingly, circuit elements, included in the first region 910 and providing a row decoder DEC, a page buffer PB, and a peripheral circuit PC, and gate electrode layers, channel structures, bitlines, and/or the like, included in the second region, may be disposed between a first substrate of the first region 910 and a second substrate of the second region 920 in the first direction.

The circuit elements, disposed in the first region 910, may include high-voltage elements and low-voltage elements. At least some of high-voltage NMOS element, among the high-voltage elements, may be surrounded by an N-well region doped with N-type impurities and may be formed in a P-well region doped with P-type impurities. In example embodiments, at least one of the low-voltage NMOS elements included in the low-voltage elements may be formed in the pocket P-well region together with the high-voltage NMOS elements to improve the degree of integration of the semiconductor device 900. In consideration of operating characteristics, a high-voltage NMOS element and a low-voltage NMOS element receiving the same body bias voltage may be formed together in one pocket P-well region.

Figure 19:
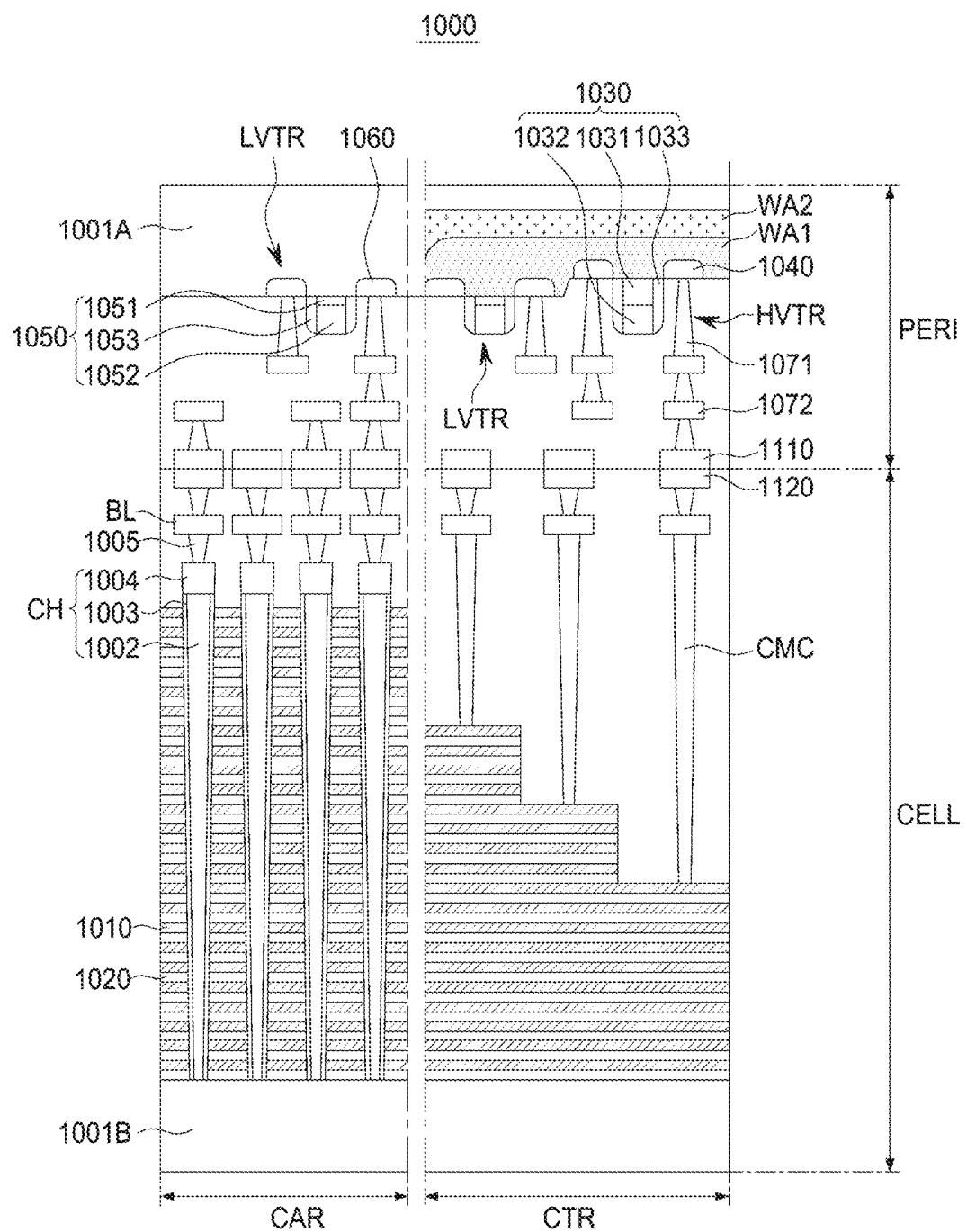
FIG. 19 is a diagram illustrating a structure of a semiconductor device according to example embodiments.

FIG. 19 is a diagram illustrating a structure of a semiconductor device according to example embodiments.

Referring to FIG. 19, a semiconductor device 1000 may include a cell region CELL and a peripheral circuit region PERI stacked in a first direction (a Z-axis direction). Unlike the example embodiments described above with reference to FIG. 17, the peripheral circuit region PERI may be stacked with the cell region CELL while being inverted. Accordingly, circuit elements HVTR and LVTR of the peripheral circuit region PERI and gate electrode layers 1020 and channel structures CH of the cell region CELL, and/or the like, may be disposed between a first substrate 1001A of the peripheral circuit region PERI and a second substrate 1001B of the cell region CELL.

As an example, the semiconductor device 1000 may have a chip-to-chip (C2C) structure. The C2C structure may refer to a structure formed by manufacturing a first chip including a peripheral circuit region PERI on a first wafer, manufacturing a second chip including a cell region CELL on a second wafer, different from the first wafer, and then connecting the first chip and the second chip to each other using a bonding manner. As an example, the bonding manner may refer to a manner of physically and electrically connecting a bonding pad, formed on an uppermost interconnection pattern layer of the first chip, and a bonding pad, formed on an uppermost interconnection pattern layer of the second chip, to each other. For example, when the bonding pads are formed of copper (Cu), the bonding manner may a Cu-to-Cu bonding manner. The bonding pads may also be formed of aluminum (Al) or tungsten (W).

The peripheral circuit region PERI may include a plurality of circuit elements HVTR and LVTR and interconnection patterns 1071 and 1072 connected to the plurality of circuit elements HVTR and LVTR. The plurality of circuit elements HVTR and LVTR may include high-voltage elements HVTR and low-voltage elements LVTR, and the interconnection patterns 1071 and 1072 may include an element contact 1071 and lower interconnections 1072. The lower interconnections 1072 may be connected to a bonding pad 1110 for coupling the cell region CELL and the peripheral circuit region PERI to each other.

The cell region CELL may include a cell array region CAR and a cell contact region CTR. The cell array region CAR may be a region in which channel structures CH are disposed, and the cell contact region CTR may be a region in which cell contacts CMC are disposed. The cell array region CAR may include gate electrode layers 810 and insulating layers 820 stacked in a first direction, perpendicular to an upper surface of a second substrate 801B, channel structures CH penetrating through the gate electrode layers 810 and the insulating layers 820, and bitlines connected to the channel structures CH. A configuration of the channel structures CH may be similar to that described above with reference to FIG. 6. The cell contact region CTR may include cell contacts CMC connected to the gate electrode layers 110.

The bitlines BL and the cell contacts CMC may be connected to a bonding pad 1120 formed on the cell region CELL. As described above in the C2C structure, a bonding pad 1110 of the peripheral circuit region PERI and a bonding pad 1120 of the cell region CELL may be connected to each other in a bonding manner.

To efficiently connect the peripheral circuit region PERI and the cell region CELL to each other, the arrangement of circuits included in the peripheral circuit region PERI may be determined depending on the arrangement of the cell array region CAR and the cell contact region CTR. As an example, a page buffer connected to the channel structures CH through the bitlines BL may be disposed in a region stacked with the cell array region CAR in the peripheral circuit region PERI. In addition, a row decoder connected to the gate electrode layers 1010 may be disposed in a region stacked with the cell contact region CTR in the peripheral circuit region PERI.

In the peripheral circuit region PERI, the high-voltage element HVTR may operate at a relatively high power supply voltage, and the low-voltage element LVTR may operate at a relatively lower power supply voltage. The configurations of the high-voltage element HVTR and the low-voltage element LVTR may be similar to those described above with reference to FIG. 17.

As an example, the high-voltage gate insulating layer 1031 may have a thickness greater than a thickness of the low-voltage gate insulating layer 1051, and the high-voltage gate 1032 and the low-voltage gate 1052 may have the same structure. Accordingly, an upper surface of the high-voltage gate 1032 may be disposed on a higher level than an upper surface of the low-voltage gate 1052. Alternatively, a recess region may be formed by removing a portion of the first substrate 1001A in a region in which the high-voltage element HVTR is formed, so the upper surface of the high-voltage gate 1032 and an upper surface of the low-voltage gate 1052 may be disposed on the same height level. In example embodiments illustrated in FIG. 19, the high-voltage element HVTR, directly connected to one of the cell contacts CMC by the bonding pads 1110 and 1120 and the interconnection patterns 1071 and 1072, may be pass elements included in a row decoder.

FIGS. 20 to 23 are diagrams illustrating a semiconductor device according to example embodiments.

Figure 20:
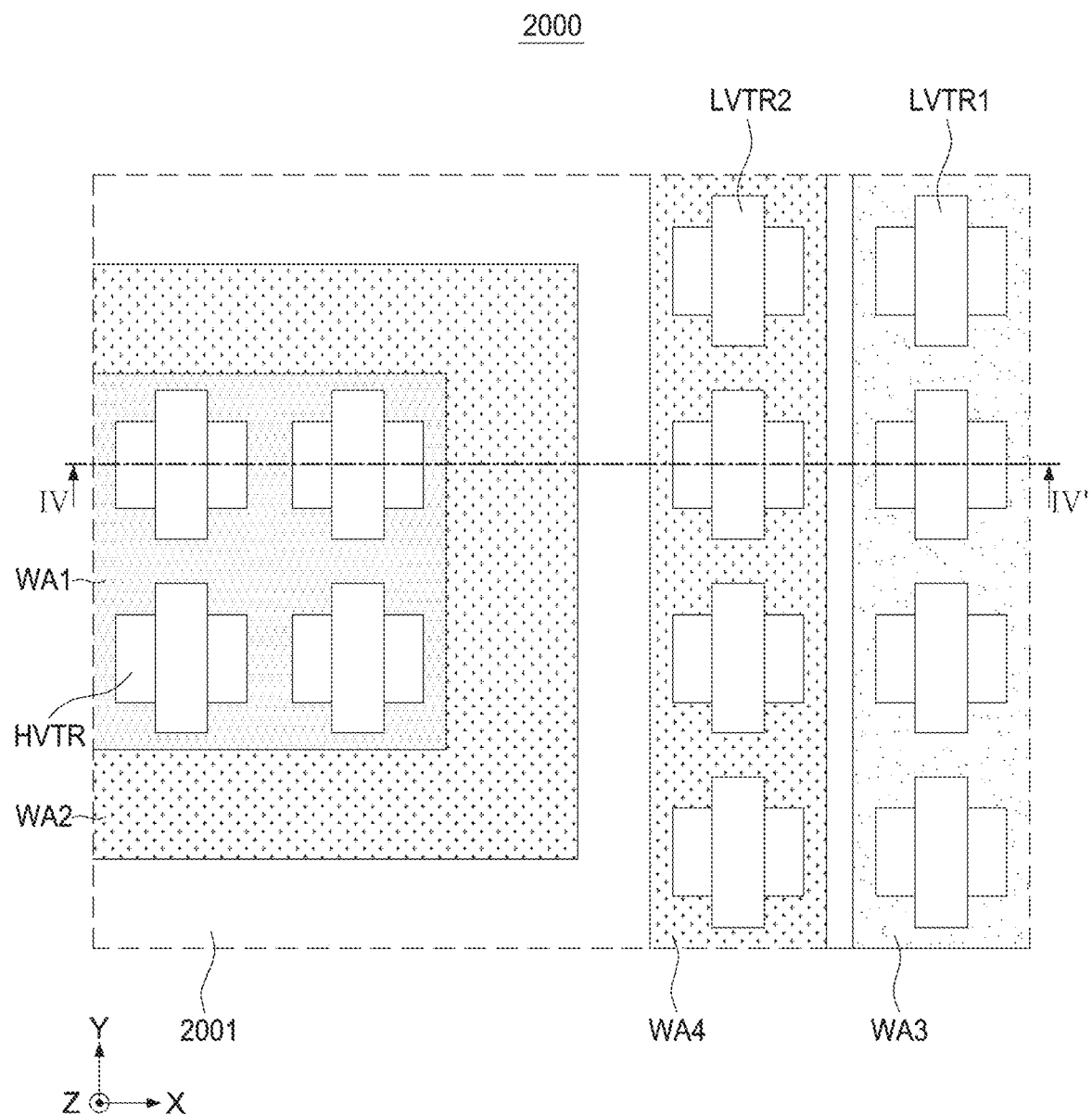
FIGS. 20 to 23 are diagrams illustrating a semiconductor device according to example embodiments.
Figure 21:
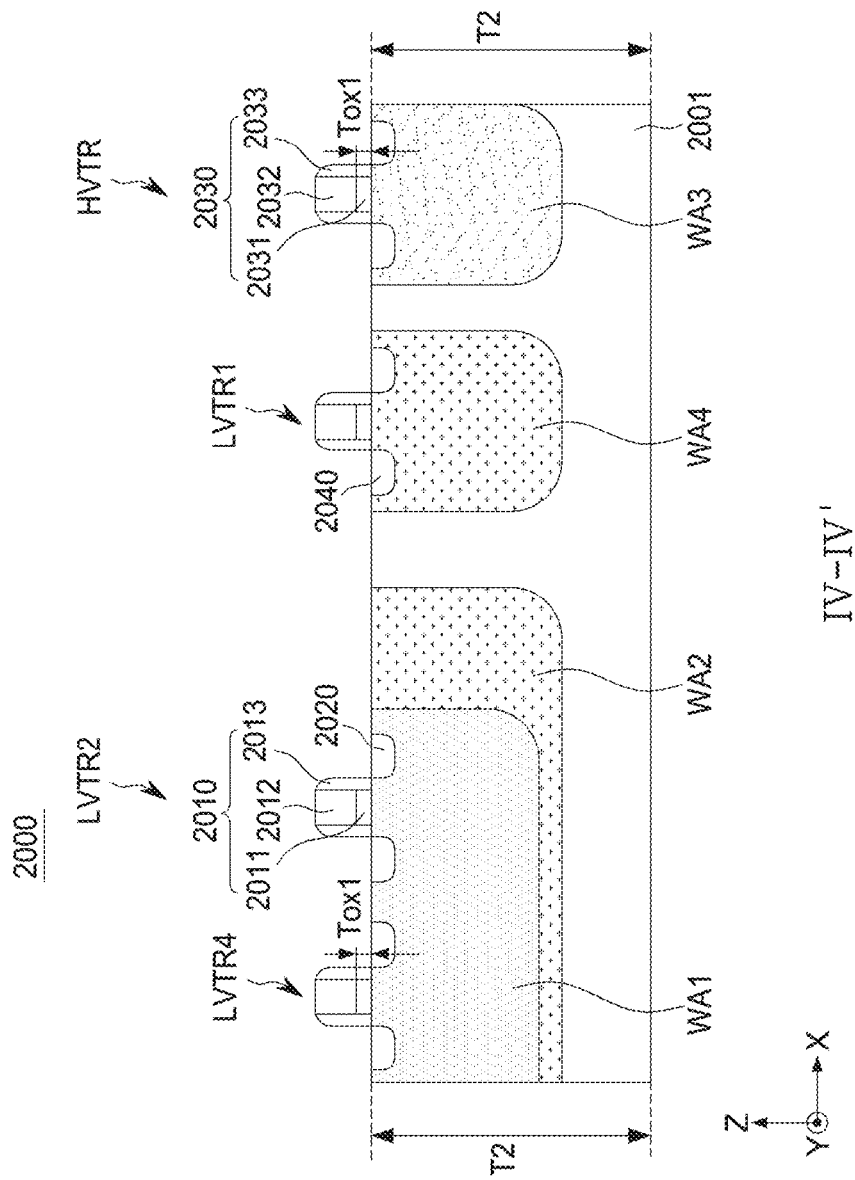
Figure 22:
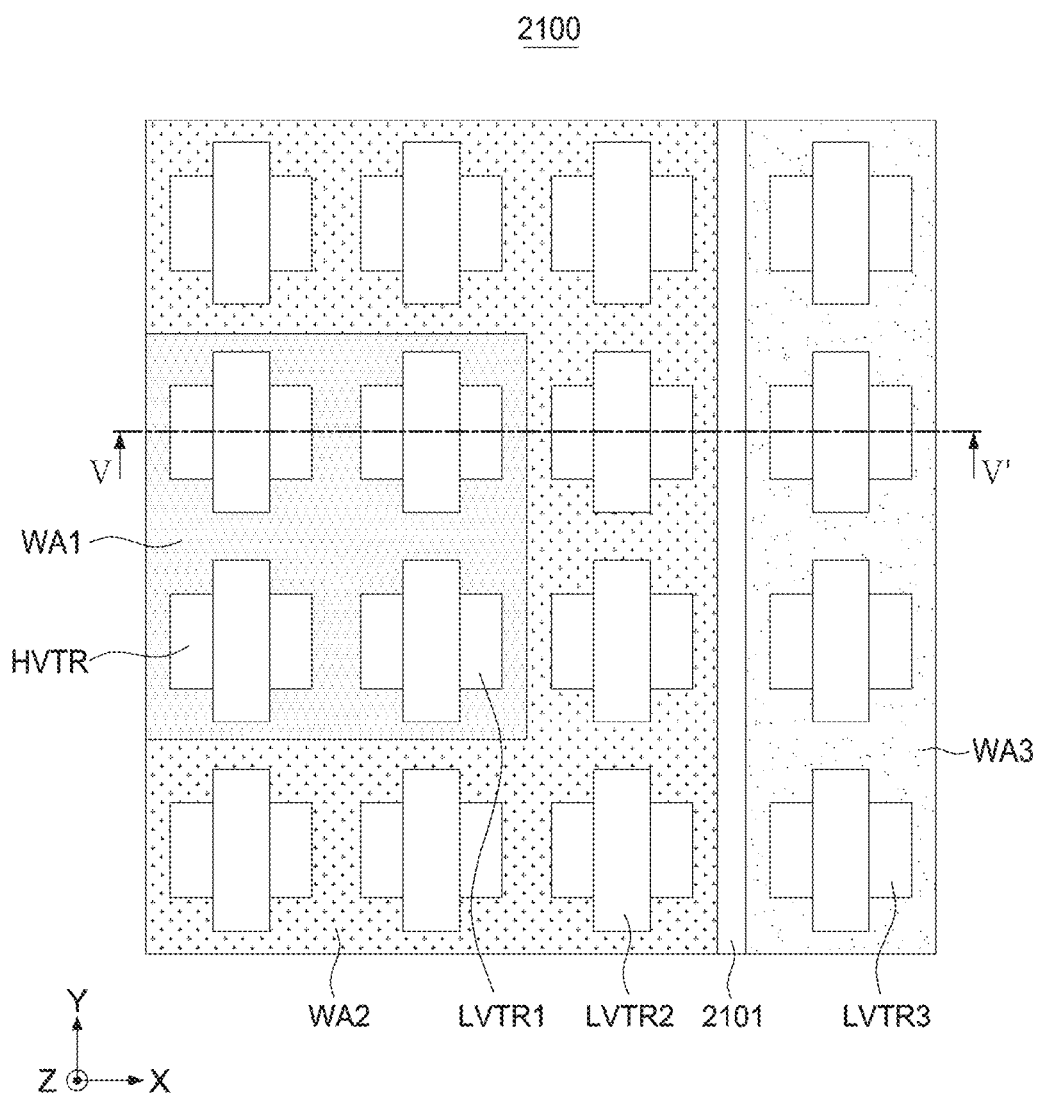
Figure 23:
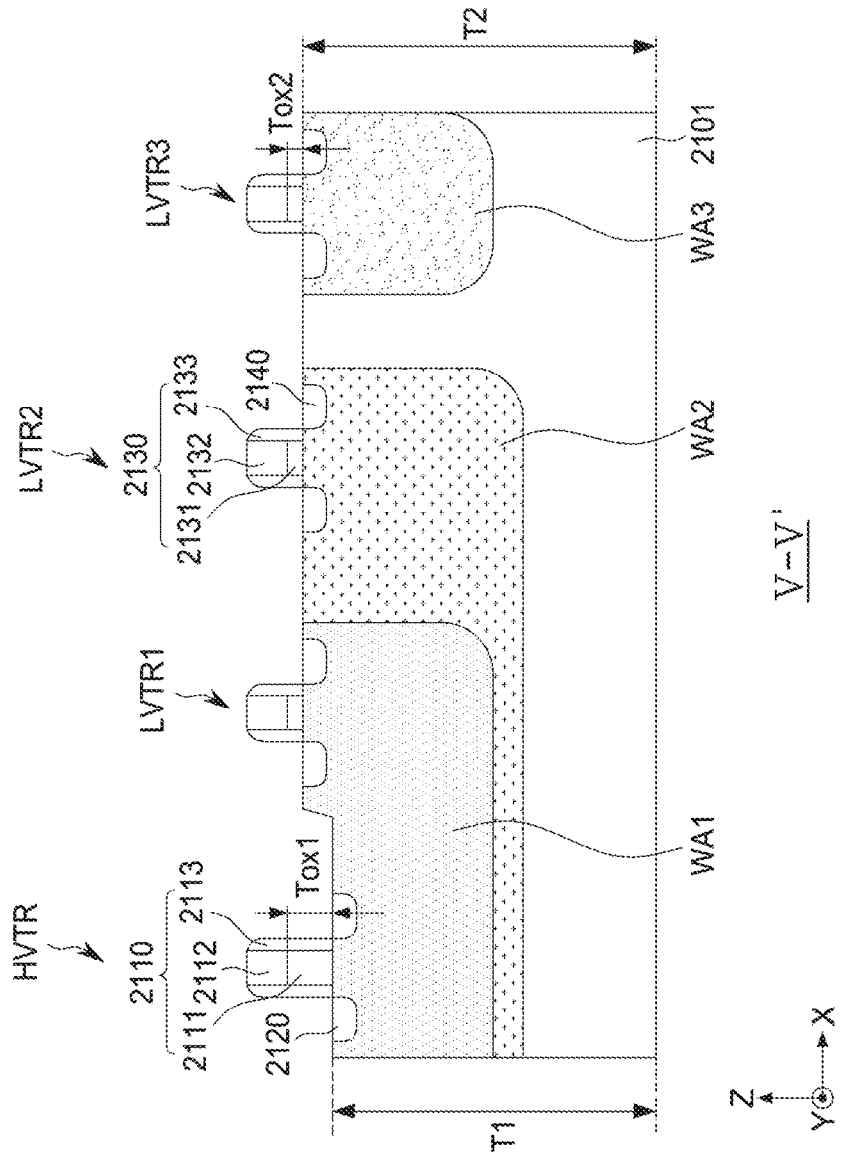

FIGS. 20 and 21 may illustrate a comparative example provided to describe a semiconductor device according to example embodiments, and FIGS. 22 and 23 may be diagrams illustrating a semiconductor device according to example embodiments.

Referring to FIGS. 20 and 21, a semiconductor device 2000 according to a comparative example may include a plurality of circuit elements HVTR, LVTR1, and LVTR2, and the plurality of circuit elements HVTR, LVTR1, and LVTR2 may be disposed in a plurality of well regions WA1 to WA4. As an example, a high-voltage element HVTR may be provided in a first well region WA1, and the first well region WA1 may be provided as a pocket P-well surrounded by a second well region WA2. Accordingly, the high-voltage element HVTR may be a high-voltage NMOS element.

Among the low-voltage elements LVTR1 and LVTR2, a first low-voltage element LVTR1 may be a low-voltage NMOS element formed in a third well region WA3 doped with P-type impurities. A second low-voltage element LVTR2 may be a low-voltage PMOS element formed in a fourth well region WA4 doped with N-type impurities. An impurity concentration of the third well region WA3 may be lower than an impurity concentration of the first well region WA1.

Referring to FIG. 21, a gate structure 2030 of the high-voltage element HVTR may include a high-voltage gate insulating layer 2031 and a high-voltage gate 2032, a gate spacer 2033, and/or the like. Each of the low-voltage elements LVTR1 and LVTR2 may include a low-voltage gate insulating layer 2051 and a low-voltage gate 2052, a gate spacer 2053, and/or the like. In example embodiments, a thickness $T_{OX1}$ of the high-voltage gate insulating layer 2031 may be greater than a thickness $T_{OX2}$ of the low-voltage gate insulating layer 2051.

Referring to FIGS. 20 and 21, no element may be formed in the second well region WA2 surrounding the first well region WA1, and the second well region WA2 and the fourth well region WA4 may be separated from each other by a predetermined or alternatively, desired gap. Accordingly, the degree of integration of the semiconductor device 2000, in which as many circuit elements HVTR, LVTR1, and LVTR2 should be disposed as possible in a limited area, may be reduced.

Referring to FIGS. 22 and 23, a semiconductor device 2100 according to example embodiments may include a plurality of circuit elements HVTR and LVTR1 to LVTR3, and the plurality of circuit elements HVTR and LVTR1 to LVTR3 may be disposed in a plurality of well regions WA1 to WA3. As an example, the high-voltage element HVTR may be disposed in a first well region WA1, and the first well region WA1 may be provided as a pocket P-well surrounding the second well region WA2. Accordingly, similarly to the example embodiments described with reference to FIGS. 20 and 21, the high-voltage element HVTR may be a high-voltage NMOS element.

Among the low-voltage elements LVTR1 to LVTR3, a first low-voltage element LVTR1 may be formed together with the high-voltage element HVTR in the first well region WA1. As an example, among the low-voltage elements LVTR1 to LVTR3, an element having the same body bias voltage as the high-voltage element HVTR may be selected as the first low-voltage element LVTR1. A second low-voltage element LVTR2 may be a low-voltage PMOS element surrounding the first well region WA1 and formed in the second well region WA2 doped with N-type impurities.

A third low-voltage element LVTR3 may be a low-voltage NMOS element formed in a third well region WA3 doped with P-type impurities. In the example embodiments illustrated in FIGS. 22 and 23, among the low-voltage NMOS elements, an element having the same body bias voltage as the high-voltage element HVTR may be selected as the first low-voltage element LVTR1 to be formed in the first well region WA1. In addition, an element having a body bias voltage different from that of the high-voltage element HVTR may be selected as a third low-voltage element LVTR3 to be formed in the third well region WA3.

Referring to FIG. 23, the gate structure 2130 of the high-voltage element HVTR may include a high-voltage gate insulating layer 2131, a high-voltage gate 2132, a gate spacer 2133, and/or the like. The gate structure 2150 of each of the low-voltage elements LVTR1 to LVTR3 may include a low-voltage gate insulating layer 2151, a low-voltage gate 2152, a gate spacer 2153, and/or the like.

In example embodiments, a thickness $T_{OX1}$ of the high-voltage gate insulating layer 2131 may be greater than a thickness $T_{OX2}$ of the low-voltage gate insulating layer 2151. The high-voltage gate 2132 and the low-voltage gate 2152 may have the same structure. Referring to FIG. 23, an upper surface of the high-voltage gate 2132 and an upper surface of the low-voltage gate 2152 may be disposed on the same height level by removing a portion of the substrate 2101 in a region in which the high-voltage element HVTR is formed. Accordingly, as illustrated in FIG. 23, the substrate may have a first thickness T1 in a region in which the first well region WA1 is formed, whereas the substrate may have a second thickness T2, greater than the first thickness T1, in a region in which the third well region WA3 and the fourth well region WA4 are formed. However, according to example embodiments, the upper surface of the high-voltage gate 2132 may be disposed on a higher level than the upper surface of the low-voltage gate 2152 by not removing a portion of the substrate.

Referring to FIGS. 22 and 23, a high-voltage NMOS element and a low-voltage NMOS element may be disposed together in the first well region WA1, and a low-voltage PMOS element may also be disposed in the second well region WA2 surrounding the first well region WA1. Accordingly, as compared with the comparative example described above with reference to FIGS. 20 and 21, many circuit elements HVTR and LVTR1 TO LVTR3 may be disposed in a smaller area, and the degree of integration of the semiconductor device 2100 may be improved.

Figure 24:
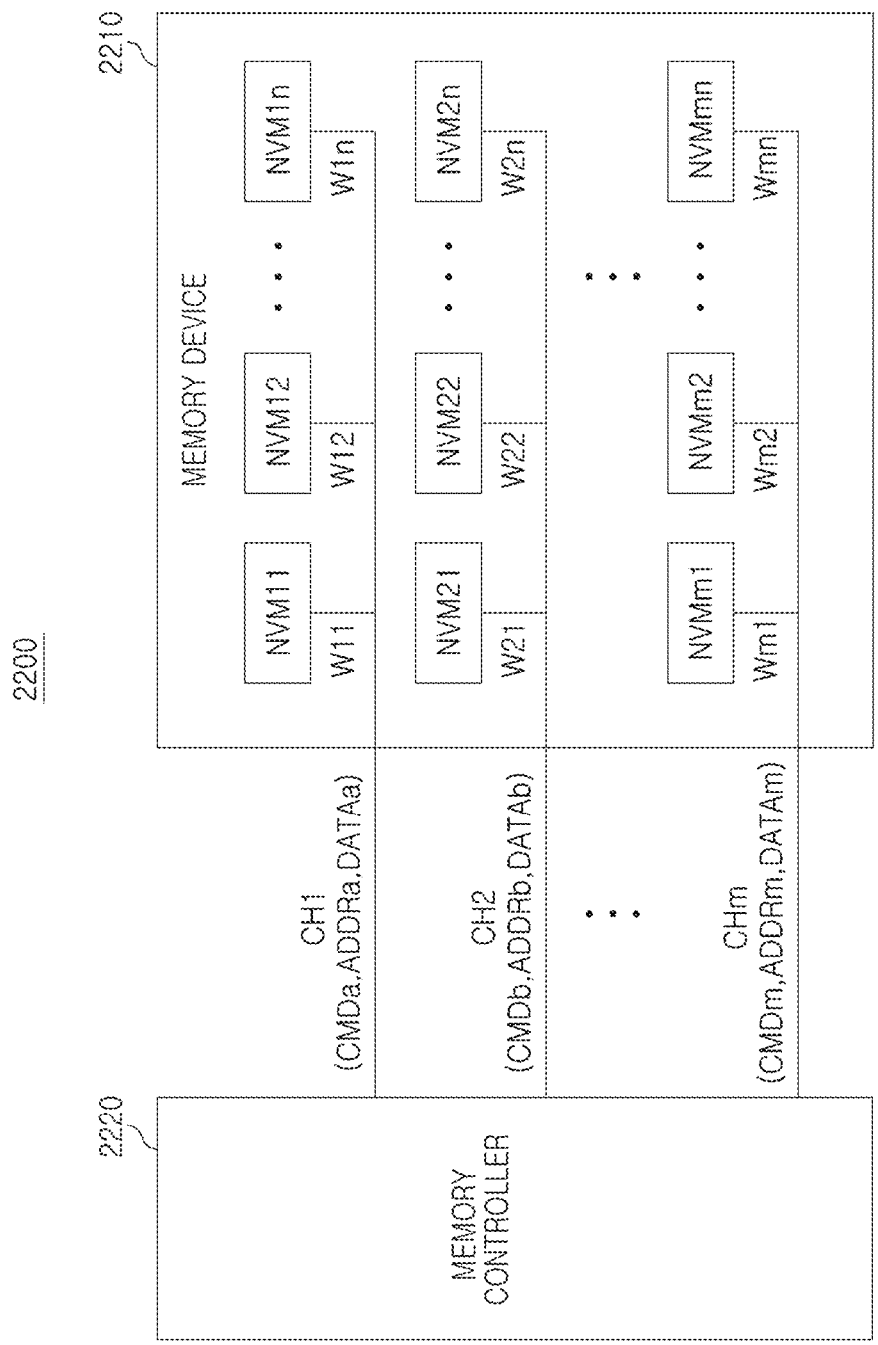
FIG. 24 is a schematic block diagram of a storage device including a semiconductor device according to example embodiments.

FIG. 24 is a schematic block diagram of a storage device including a semiconductor device according to example embodiments.

Referring to FIG. 24, a memory system 2200 may include a memory device 2210 and/or a memory controller 2220. The memory system 2200 may support a plurality of channels CH1 to CHm, and the memory device 2210 and the memory controller 2220 may be connected to each other through the plurality of channels CH1 to CHm. For example, the memory system 2200 may be implemented as a storage device such as a solid state drive (SSD).

The memory device 2210 may include a plurality of memory elements NVM11 to NVMmn Each of the memory elements NVM11 to NVMmn may be connected to one of the plurality of channels CH1 to CHm through a corresponding way. For example, the memory elements NVM11 to NVM1n may be connected to a first channel CH1 through ways W11 to W1n, and memory elements NVM21 to NVM2n may be connected to a second channel CH2 through ways W21 to W2n. In example embodiments, each of the memory elements NVM11 to NVMmn may be implemented as any memory unit which may operate depending on an individual command from the memory controller 2220. For example, each of the memory elements NVM11 to NVMmn may be implemented as a chip or a die, but example embodiments are not limited thereto.

The memory controller 2220 may transmit and receive signals to and from the memory device 10 through the plurality of channels CH1 to CHm. For example, the memory controller 20 may transmit commands CMDa to CMDm, addresses ADDRa to ADDRm, and data DATAa to DATAm to the memory device 2210 through the channels CH1 to CHm, or may receive the data DATAa to DATAm from the memory device 2210 through the channels CH1 to CHm.

The memory controller 2220 may select a nonvolatile memory device, among nonvolatile memory elements connected to a corresponding channel through each channel, and may transmit and receive signals to and from the selected nonvolatile memory elements. For example, the memory controller 2220 may select a nonvolatile memory device NVM11, among the memory elements NVM11 to NVM1n connected to a first channel CH1. The memory controller 2220 may transmit the command CMDa, the address ADDRa, and the data DATAa to the selected memory device NVM11 through the first channel CH1, or may receive the data DATAa from the selected memory device NVM11.

The memory controller 2220 may transmit and receive signals to and from different channels, in parallel, through different channels. For example, the memory controller 2220 may transmit the command CMDb to the memory device 2210 through a second channel CH2 while transmitting the command CMDa to the memory device 2210 through the first channel CH1. For example, the memory controller 2220 may receive data DATAb from the memory device 2210 through the second channel CH2 while receiving data DATAa from the memory device 10 through the first channel CH1.

The memory controller 2220 may control the overall operation of the memory device 2210. The memory controller 2220 may transmit signals to the channels CH1 to CHm to control each of the memory elements NVM11 to NVMmn connected to the channels CH1 to CHm. For example, the memory controller 2220 may transmit a command CMDa and an address ADDRa to the first channel CH1 to control a selected one of the memory elements NVM11 to NVM1n.

Each of the memory elements NVM11 to NVMmn may operate under the control of the memory controller 2220. For example, the memory device NVM11 may program the data DATAa based on the command CMDa, the address ADDRa, and the data DATAa provided to the first channel CH1. For example, the memory device NVM21 may read the data DATAb based on the command CMDb and the address ADDRb provided to the second channel CH2, and may transmit the read data DATAb to the memory controller 20.

In FIG. 24, the memory device 2210 is illustrated as communicating with the memory controller 20 through m channels and including n nonvolatile memory elements to correspond to each channel. However, the number of channels and the number of nonvolatile memory elements connected to a single channel may vary.

The memory device 2210 and the memory controller 2220 may be implemented as a semiconductor device according to example embodiments. As an example, in the memory device 2210 and the memory controller 2220, a high-voltage NMOS device and a low-voltage NMOS element may be formed together in a single pocket P-well region, and a low-voltage PMOS element may be formed in an N-well region surrounding the pocket P-well region. Accordingly, the degree of integration of the memory device 2210 and the memory controller 2220 may be improved, and operation performance thereof may also be improved.

As described above, both high-voltage elements and low-voltage elements may be formed in a first well region formed in a peripheral circuit region and receiving a negative voltage as a body bias voltage, and low-voltage elements may also be formed in a second well region surrounding the first well region. Accordingly, the degree of integration of circuit elements formed in a peripheral circuit region may be improved to improve the degree of integration of a semiconductor device, and an electrical path between the circuit elements may be efficiently disposed to improve performance of the semiconductor device.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of the present inventive concepts as defined by the appended claims.

What is claimed is:

1. A semiconductor device comprising:
a peripheral circuit region including circuit elements on a substrate, the circuit elements of a page buffer and a row decoder; and
a cell region including gate electrode layers, stacked in a first direction, perpendicular to an upper surface of the substrate, and connected to the row decoder, and channel structures extending in the first direction to penetrate through the gate electrode layers and to be connected to the page buffer,
wherein the row decoder includes high-voltage elements, operating at a first power supply voltage, and low-voltage elements operating at a second power supply voltage, lower than the first power supply voltage,
at least one first high-voltage element, among the high-voltage elements, is in a first well region doped with impurities having a first conductivity-type, and
at least one of the low-voltage elements is in a second well region surrounding the first well region and doped with impurities having a second conductivity-type, different from the first conductivity-type.

2. The semiconductor device of claim 1, wherein the high-voltage elements are pass elements of the row decoder, and
the low-voltage elements are of a block decoder, a high-voltage switching circuit, and a pull-up circuit of the row decoder.

3. The semiconductor device of claim 1, wherein the low-voltage elements include first low-voltage elements and second low-voltage elements, at least one of the first low-voltage elements is in the first well region, and at least one of the second low-voltage elements is in the second well region.

4. The semiconductor device of claim 1, wherein each of the high-voltage elements includes a high-voltage gate and a high-voltage gate insulating layer between the high-voltage gate and the substrate, and each of the low-voltage elements includes a low-voltage gate and a low-voltage gate insulating layer between the low-voltage gate and the substrate, and
a thickness of the high-voltage gate insulating layer is greater than a thickness of the low-voltage gate insulating layer.

5. The semiconductor device of claim 4, wherein an upper surface of the high-voltage gate insulating layer and an upper surface of the low-voltage gate insulating layer are on the same height level.

6. The semiconductor device of claim 5, wherein a thickness of the first well region in a region, in which the first high-voltage element is, is smaller than a thickness of the first well region in a region in which the first low-voltage element is disposed.

7. The semiconductor device of claim 4, wherein an upper surface of the high-voltage gate insulating layer is at a higher level than an upper surface of the low-voltage gate insulating layer.

8. The semiconductor device of claim 7, wherein a thickness of the first well region in a region, in which the first high-voltage element is disposed, is the same as a thickness of the first well region in a region in which the first low-voltage element is disposed.

9. The semiconductor device of claim 3, wherein the substrate includes a third well region doped with impurities having the first conductivity-type and separated from the first well region and the second well region, and at least some of the first low-voltage elements are in the third well region.

10. The semiconductor device of claim 9, wherein a negative voltage is input to the first well region, and a ground voltage is input to the first well region.

11. The semiconductor device of claim 9, wherein the substrate includes a fourth well region doped with impurities having the second conductivity-type and separated from the first to third well regions, and at least some of the second low-voltage elements are in the fourth well region.

12. The semiconductor device of claim 11, wherein an impurity concentration of the fourth well region is higher than an impurity concentration of the second well region.

13. The semiconductor device of claim 1, wherein the row decoder is adjacent to the cell region in a second direction, parallel to the upper surface of the substrate, and the page buffer is adjacent to the cell region in a third direction, parallel to the upper surface of the substrate and intersecting the second direction.

14. The semiconductor device of claim 1, wherein the substrate is a first substrate, the cell region includes a second substrate stacked with the peripheral circuit region in the first direction, and the channel structures extend in the first direction to be connected to the second substrate.

15. The semiconductor device of claim 14, wherein the circuit elements, the gate electrode layers, and the channel structures are between the first substrate and the second substrate in the first direction.

* * * * *